United States Patent
Jang

(10) Patent No.: US 11,810,837 B2
(45) Date of Patent: Nov. 7, 2023

(54) SEMICONDUCTOR PACKAGES

(71) Applicant: Samsung Electronics Co., Ltd., Suwon-si (KR)

(72) Inventor: Chulyong Jang, Anyang-si (KR)

(73) Assignee: Samsung Electronics Co., Ltd.

(*) Notice: Subject to any disclaimer, the term of this patent is extended or adjusted under 35 U.S.C. 154(b) by 61 days.

(21) Appl. No.: 17/325,745

(22) Filed: May 20, 2021

(65) Prior Publication Data

US 2022/0102245 A1 Mar. 31, 2022

(30) Foreign Application Priority Data

Sep. 28, 2020 (KR) ........................ 10-2020-0125675

(51) Int. Cl.
*H01L 23/48* (2006.01)
*H01L 23/498* (2006.01)
(Continued)

(52) U.S. Cl.
CPC ........ *H01L 23/481* (2013.01); *H01L 23/3171* (2013.01); *H01L 23/49816* (2013.01);
(Continued)

(58) Field of Classification Search
CPC ............... H01L 2224/0554–05999; H01L 2224/05541–05548; H01L 2224/02–09519; H01L 2224/0555–05559; H01L 2224/0556–05572; H01L 2224/05575–05584; H01L 2224/05075–05084; H01L 2224/05073; H01L 2224/0502–05027; H01L 24/02–09; H01L 24/80; H01L 2224/0501–05019; H01L 2224/05005–05009; H01L 2224/05001–05499; H01L 2224/0603; H01L 2224/06051; H01L 2224/06102; H01L 2224/06505; H01L 2224/06515–06519; H01L 2224/0801; H01L 2224/08052–0807; H01L 2224/081–08268; H01L 2224/085–08506; H01L 2224/0901; H01L 2224/09051–09055; H01L 2224/091–09183; H01L 2224/09505;
(Continued)

(56) References Cited

U.S. PATENT DOCUMENTS 9,159,672 B1  10/2015  Hiner et al.
9,431,332 B2   8/2016  Park
(Continued)

*Primary Examiner* — Dale E Page
*Assistant Examiner* — Lawrence C Tynes, Jr.
(74) *Attorney, Agent, or Firm* — Myers Bigel, P.A.

(57) ABSTRACT

A semiconductor package includes a plurality of semiconductor chips. At least one of the semiconductor chips includes a semiconductor substrate including a semiconductor layer and a passivation layer having a third surface, a backside pad on the third surface, and a through-via penetrating through the semiconductor substrate. The backside pad includes an electrode pad portion, on the third surface, and a dam structure protruding on one side of the electrode pad portion and surrounding a side surface of the through-via. The dam structure is spaced apart from the side surface of the through-via.

20 Claims, 26 Drawing Sheets

(51) Int. Cl.
*H01L 23/538* (2006.01)
*H01L 25/065* (2023.01)
*H01L 23/31* (2006.01)
*H01L 23/00* (2006.01)

(52) U.S. Cl.
CPC .. *H01L 23/49822* (2013.01); *H01L 23/49833* (2013.01); *H01L 23/49838* (2013.01); *H01L 23/5385* (2013.01); *H01L 23/5386* (2013.01); *H01L 24/08* (2013.01); *H01L 24/16* (2013.01); *H01L 25/0655* (2013.01); *H01L 25/0657* (2013.01); *H01L 2224/0214* (2013.01); *H01L 2224/0215* (2013.01); *H01L 2224/02125* (2013.01); *H01L 2224/08059* (2013.01); *H01L 2224/16146* (2013.01); *H01L 2224/16148* (2013.01); *H01L 2224/16237* (2013.01); *H01L 2225/06513* (2013.01); *H01L 2225/06517* (2013.01); *H01L 2225/06544* (2013.01); *H01L 2225/06548* (2013.01); *H01L 2924/1431* (2013.01); *H01L 2924/1434* (2013.01); *H01L 2924/3512* (2013.01)

(58) Field of Classification Search
CPC ............ H01L 2224/09515–09519; H01L 2224/03–03921; H01L 2224/80001–80986; H01L 2224/80895–80896; H01L 2224/0812–08268; H01L 2224/08135–08148; H01L 2224/08151–08268; H01L 2224/0212–0226; H01L 2224/02135; H01L 2224/10145; H01L 2224/02125–02126; H01L 2224/02165–02166; H01L 2224/0213; H01L 2224/0217; H10B 61/00
See application file for complete search history.

(56) References Cited

U.S. PATENT DOCUMENTS

| | | |
|---|---|---|
| 9,978,666 B2 | 5/2018 | Wu et al. |
| 10,410,879 B2 | 9/2019 | Gandhi et al. |
| 10,418,338 B2 | 9/2019 | Uzoh |
| 2009/0160061 A1 | 6/2009 | Hsu et al. |
| 2010/0213560 A1 | 8/2010 | Wang et al. |
| 2012/0244648 A1 | 9/2012 | Matsuhashi et al. |
| 2013/0093061 A1 | 4/2013 | Hisaka et al. |
| 2013/0140690 A1 | 6/2013 | Lin et al. |
| 2014/0008815 A1 | 1/2014 | Park et al. |
| 2015/0333014 A1* | 11/2015 | Wirz ............... H01L 21/76871 257/774 |
| 2016/0020184 A1* | 1/2016 | Park ............... H01L 24/05 257/737 |
| 2016/0155686 A1* | 6/2016 | Lee ............... H01L 23/5226 257/737 |
| 2017/0025384 A1* | 1/2017 | Park ............... H01L 23/481 |
| 2020/0161242 A1* | 5/2020 | Lin ............... H01L 25/0652 |

\* cited by examiner

SEMICONDUCTOR PACKAGES

CROSS-REFERENCE TO RELATED APPLICATION(S)

This application claims the benefit of priority to Korean Patent Application No. 10-2020-0125675, filed on Sep. 28, 2020 in the Korean Intellectual Property Office, the disclosure of which is incorporated herein by reference in its entirety.

BACKGROUND

The present disclosure relates to semiconductor packages. It may be beneficial for semiconductor packages mounted on electronic devices to be compact, to have high performance, and to have high capacity. In order to implement this, research and development (R&D) of a semiconductor package, in which semiconductor chips having through-silicon vias (TSVs) are vertically stacked, is being conducted.

SUMMARY

Example embodiments provide a semiconductor package having improved through-via reliability.

According to an example embodiment, a semiconductor package includes a plurality of semiconductor chips electrically connected to each other and stacked in a first direction. At least one of the plurality of semiconductor chips includes a semiconductor substrate including a semiconductor layer, having a first surface and a second surface that are opposite each other, and a passivation layer on the first surface and having a third layer that is opposite the first surface, a circuit structure on the second surface, a frontside pad on the circuit structure, a backside pad on the third surface, and a through-via in the semiconductor substrate and extending between the second surface and the third surface to be electrically connected to the backside pad and the frontside pad. The backside pad includes an electrode pad portion, on the third surface, and a dam structure protruding toward the first surface on one side of the electrode pad portion and surrounding a side surface of the through-via. The dam structure is spaced apart from the side surface of the through-via.

According to an example embodiment, a semiconductor package includes at least one semiconductor chip. The at least one semiconductor chip has an active surface and an inactive surface that are opposite each other and includes a backside pad on the inactive surface, a frontside pad on the active surface, and a through-via electrically connecting the backside pad and the frontside pad to each other. The backside dam includes an electrode pad portion and a dam structure that extends in a first direction from the electrode pad portion toward the active surface and surrounds the through-via. A ratio of a width of the backside pad in a second direction, horizontal to the active surface, to a width of the through-via in the second direction is within a range of about 5:1 to about 3:1. The dam structure is spaced apart from a side surface of the through-via.

According to an example embodiment, a semiconductor package includes: a first semiconductor chip including a first semiconductor layer having a first surface and a second surface that are opposite each other, a passivation layer having a third surface that is opposite the first surface and a trench that is in the third surface, a through-via penetrating the semiconductor layer and the passivation layer, and a backside pad on the third surface and electrically connected to the through-via; a second semiconductor chip including a frontside pad and on the first semiconductor chip in such a manner that the frontside pad faces the backside pad; and a connection bump electrically connecting the backside pad and the frontside pad to each other. The trench is spaced apart from the through-via in a first direction, horizontal to the third surface. A spacing distance between the trench and the through-via is within a range of about 2 micrometers (μm) to about 5 μm. A ratio of a depth of the trench in a second direction, perpendicular to the third surface, to a maximum distance between the third surface and the first surface is about 0.5:1 to about 0.8:1. The backside pad includes a dam structure in the trench.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
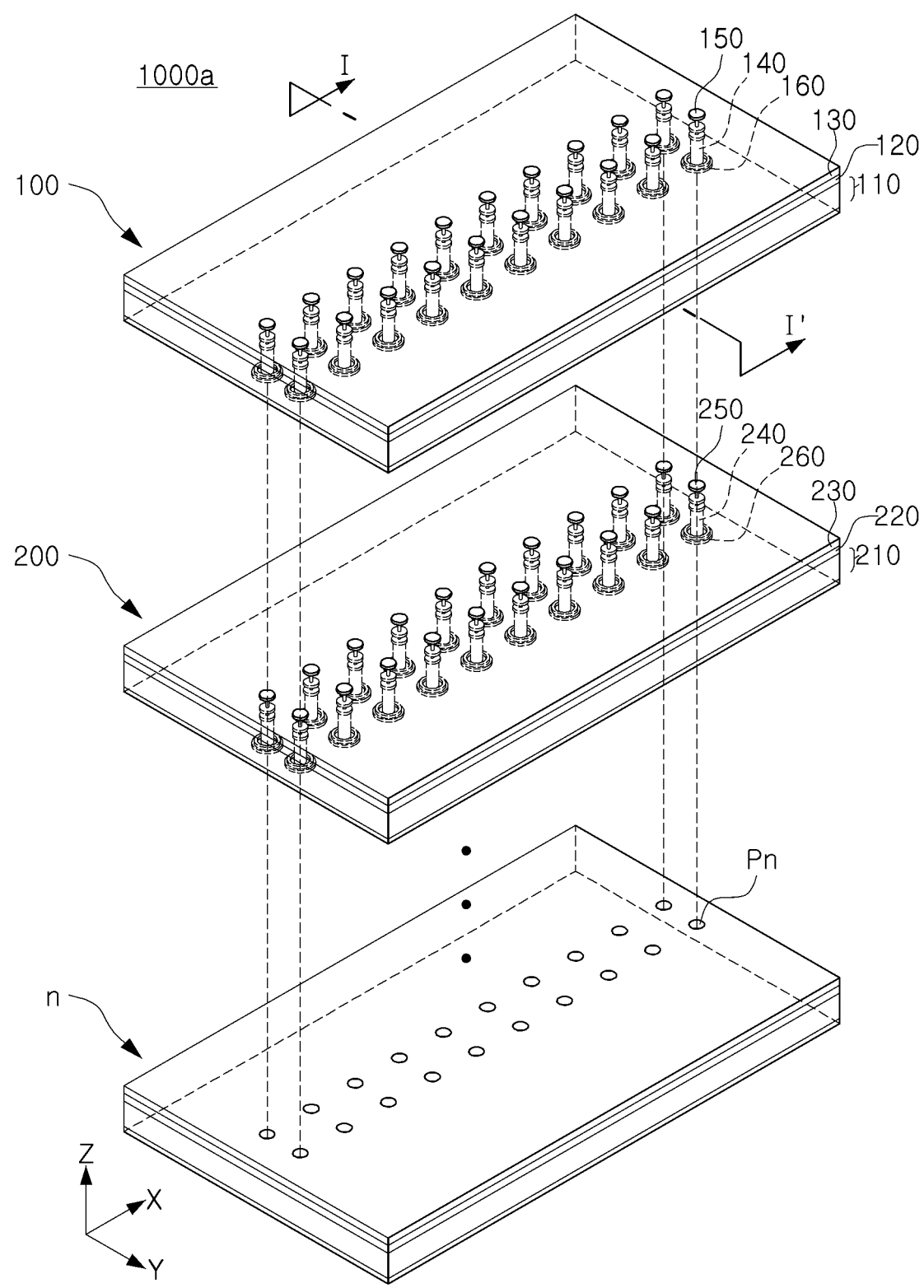
FIG. 1 is an exploded perspective view of a semiconductor package according to an example embodiment.
Figure 2:
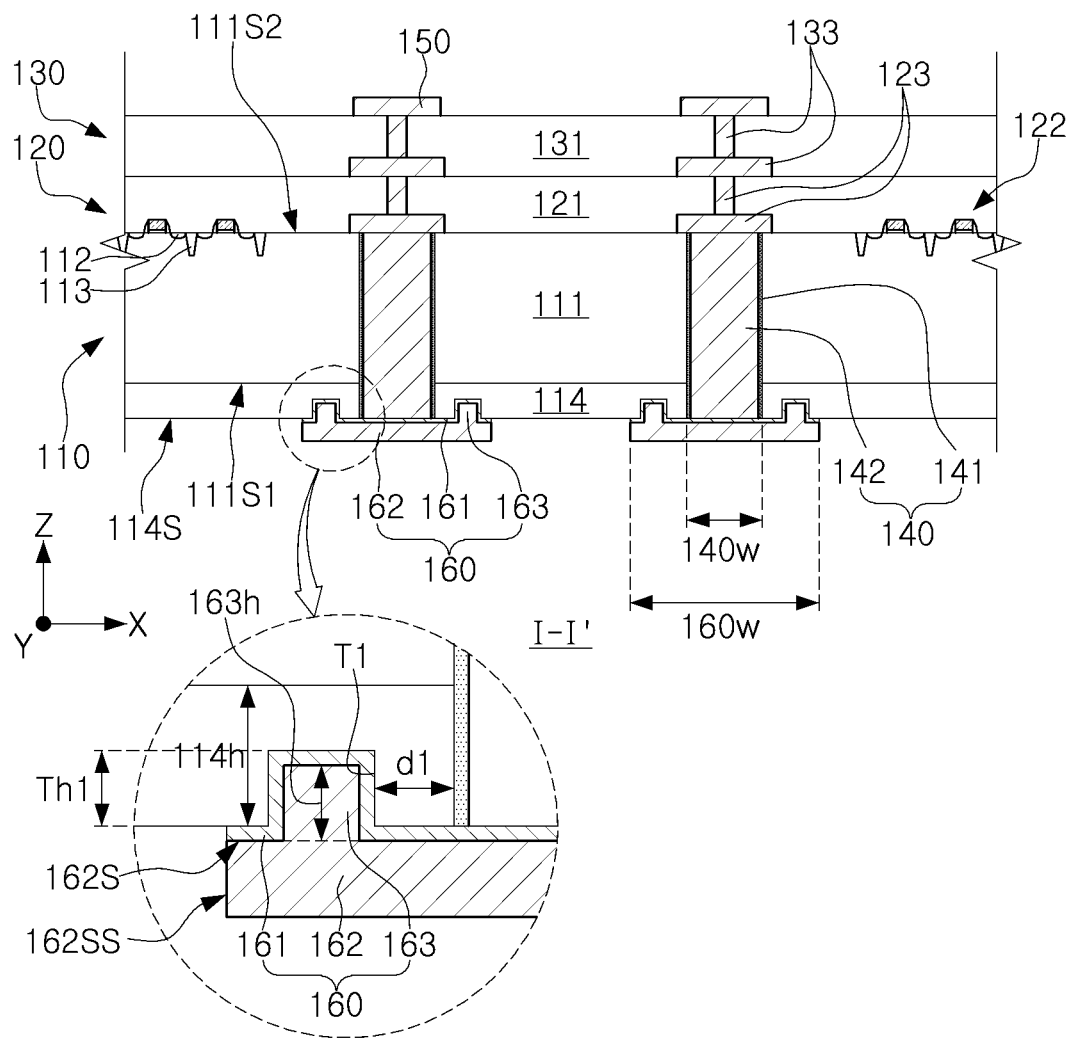
FIG. 2 is a cross-sectional view taken along line I-I' of FIG. 1.
Figure 3A:
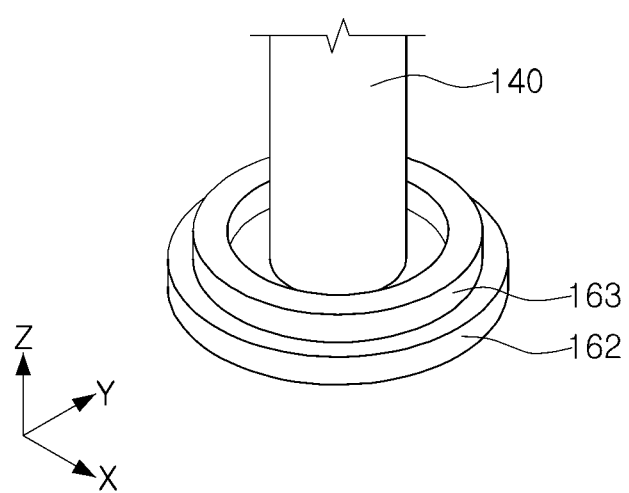
FIGS. 3A and 3B are perspective views of selected components of FIG. 2.
Figure 3B:
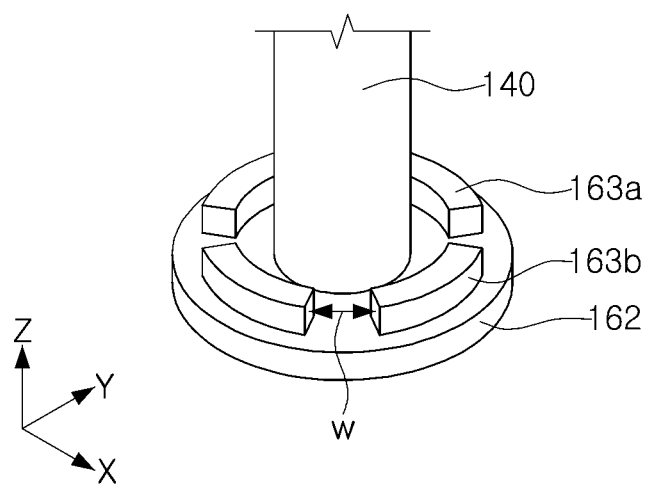
Figure 4A:
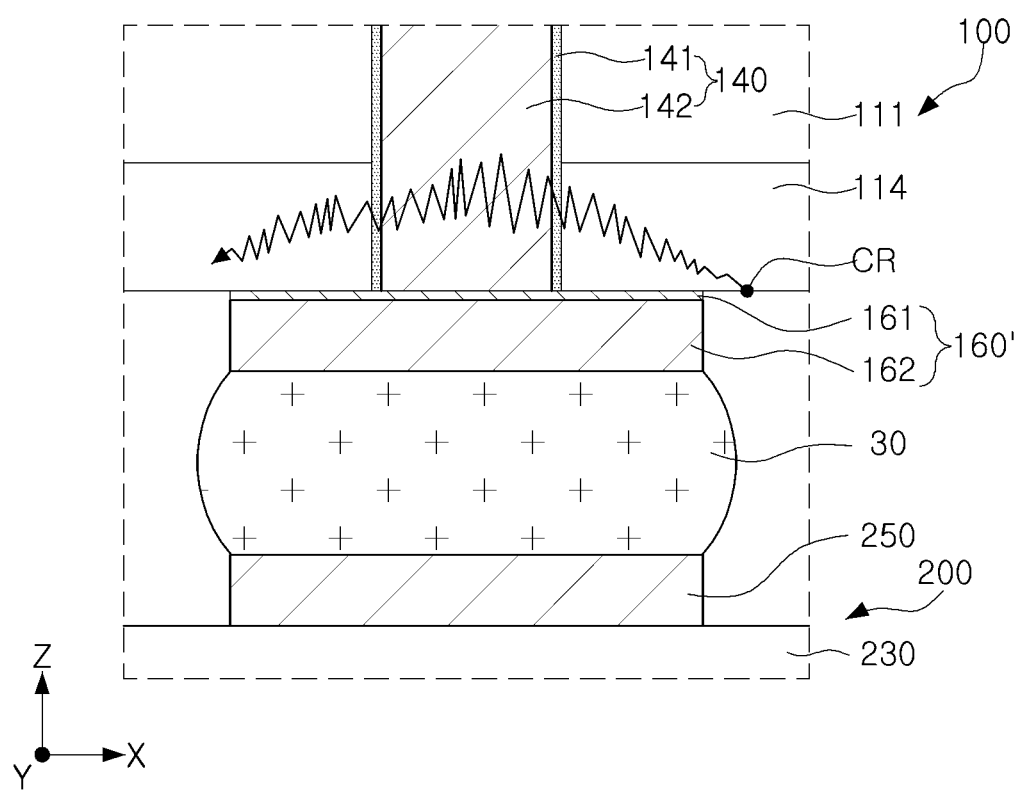
FIGS. 4A and 4B are partially enlarged views illustrating propagation aspects of cracking around a through-via before and after applying a dam structure according to the present disclosure.
Figure 4B:
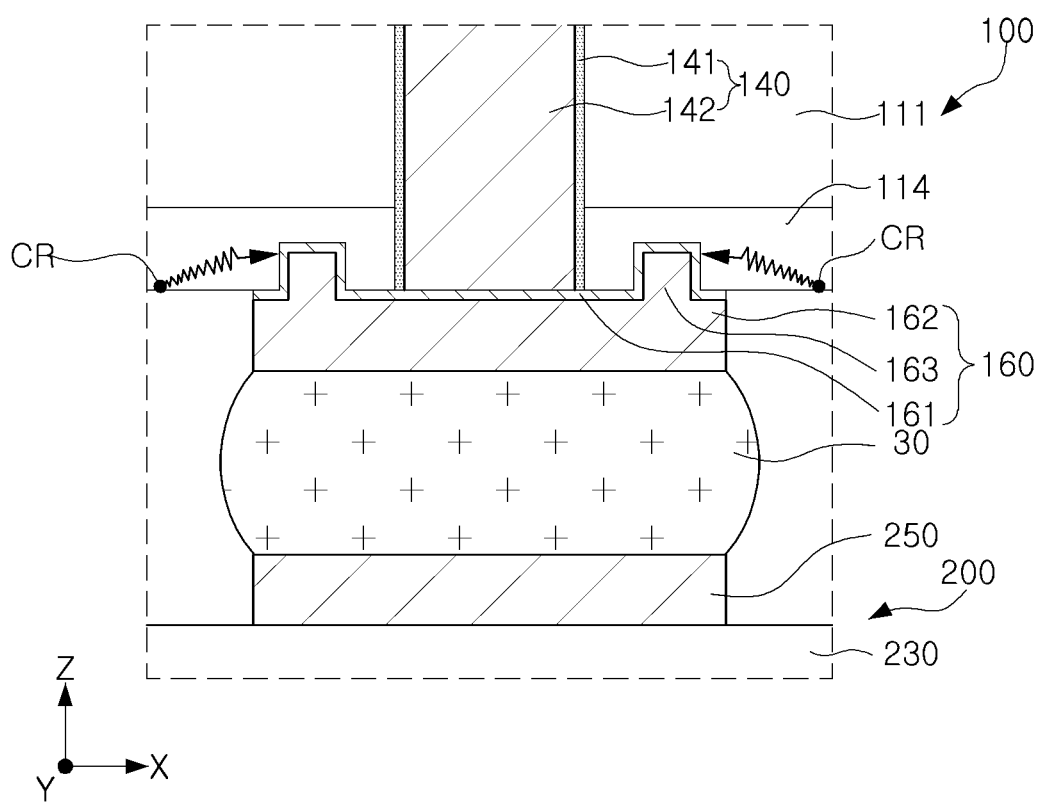

FIG. 1 is an exploded perspective view of a semiconductor package 1000*a* according to an example embodiment, FIG. 2 is a cross-sectional view taken along line I-I' of FIG. 1, FIGS. 3A and 3B are perspective views of selected components of FIG. 2, and FIGS. 4A and 4B are partially enlarged views illustrating propagation aspects of cracking CR around a through-via 140 before and after applying a dam structure according to the present disclosure.

Referring to FIG. 1, the semiconductor package 1000a may include a plurality of semiconductor chips 100, 200, . . . , and n electrically connected to each other and stacked in a vertical direction (a Z-axis direction). Each of the semiconductor chips 100, 200, . . . , and n may include a logic chip or a memory chip. For example, the plurality of semiconductor chips 100, 200, . . . , and n may include a logic chip such as a central processing unit (CPU), a graphics processing unit (GPU), a field programmable gate array (FPGA), a digital signal processor (DSP), a cryptographic processor, a microprocessor, a microcontroller, an analog-digital converter, or an application-specific integrated circuit (ASIC), or a volatile memory chip such as a dynamic random access memory (DRAM) or a static random access memory (SRAM), or a nonvolatile memory chip such as a phase-change random access memory (PRAM), a magnetic random access memory (MRAM), a resistive random access memory (RRAM), or a flash memory. All of the semiconductor chips 100, 200, . . . , and n may be the same type of memory chip. Alternatively, some of the semiconductor chips 100, 200, . . . , and n may be memory chips and some thereof may be logic chips. The number of the plurality of semiconductor chips 100, 200, . . . , and n is not necessarily limited, and two, four, eight, sixteen, or more semiconductor chips may be stacked. Among the semiconductor chips 100, 200, . . . , and n, the lowermost semiconductor chip n may include only a frontside pad Pn without having a through-via. The lowermost semiconductor chip n may correspond to an uppermost stacked semiconductor chip of FIG. 13 to be described later. Accordingly, since a connection terminal on a frontside is unnecessary, the lowermost semiconductor chip n may not have a through-via.

The first semiconductor chip 100 and the second semiconductor chip 200, illustrated in the drawings, may include frontside pads 150 and 250 and backside pads 160 and 260, and through-vias 140 and 240 for electrical connection therebetween. For example, the first backside pad 160 and the second frontside pad 250, corresponding to each other, may be electrically connected to each other through a connection member (for example, a solder ball). The second frontside pad 250 may be a connection pad of a bare chip or a metal bump structure formed on a connection pad of a bare chip. In an example embodiment, the plurality of semiconductor chips 100, 200, . . . , and n may have substantially the same technical features. Therefore, referring to FIG. 2 together with FIG. 1, features of the semiconductor package 1000a according to an example embodiment will be described while focusing on the first semiconductor chip 100. FIG. 2 illustrates a cross section of the first semiconductor chip 100 taken along line I-I' of FIG. 1.

Referring to FIG. 2 together with FIG. 1, the semiconductor package 1000a according to an example embodiment may include a semiconductor chip 100 including a semiconductor substrate 110, a first circuit structure 120 and a second circuit structure 130 (hereinafter, the structures 120 and 130 may be collectively or individually referred to as "circuit structure"), a through-via 140, a frontside pad 150, and a backside pad 160. Similarly, a semiconductor chip 200 may include a semiconductor substrate 210 and circuit structures 220 and 230, as well as a through-via 240, a frontside pad 250, and a backside pad 260.

The semiconductor substrate 110 may include a semiconductor layer 111 having a first surface 111S1 and a second surface 111S2 that are opposite (e.g., disposed to oppose) each other, a plurality of conductive regions 112 and isolation regions 113 formed in the semiconductor layer, and a passivation layer 114 disposed on the first surface 111S1 and having a third surface 114S disposed to oppose the first surface 111S1. The semiconductor substrate 110 may be a semiconductor wafer. The semiconductor layer 111 may include a semiconductor element such as silicon or germanium, or a compound semiconductor such as silicon carbide (SiC), gallium arsenide (GaAs), indium arsenide (InAs), or indium phosphide (InP). The conductive region 112 may be, for example, a well doped with impurities or a structure doped with impurities. The isolation region 113 may be a device isolation structure having a shallow trench isolation (STI) structure, and may include silicon oxide.

The passivation layer 114 may be an insulating layer including silicon oxide, silicon nitride, a polymer, or a combination thereof. The passivation layer 114 may be disposed between the backside pad 160 and the semiconductor layer 111 and may surround a portion of a side surface of the through-via 140. The passivation layer 114 may be formed by a chemical vapor deposition (CVD) process. A thickness 114h of the passivation layer 114 is not necessarily limited, but may be about 2 μm or more to protect semiconductor chips, through-vias, and the like. For example, the thickness 114h of the passivation layer 114 may be within the range of about 2 μm to about 5 μm.

The passivation layer 114 may have a trench T1 formed by recessing a portion of the third surface 114S. The trench T1 may provide a space in which a dam structure 163 of the backside pad 160 to be described later is formed (e.g., where the dam structure 163 penetrates the third surface 114S such that the dam structure 163 protrudes beyond the third surface 114S toward the first surface 111S1 without contacting the first surface 111S1). Therefore, the trench T1 may be spaced apart from the through-via 140 in a horizontal direction (an X-axis direction that may be perpendicular to the Z-axis direction), horizontal to a third surface 114S, to secure a sufficient spacing distance between the through-via 140 and the dam structure 163 including the conductive material. For example, a spacing distance dl between the trench T1 and the through-via 140 may be within the range of about 2 μm to about 5 μm. When the spacing distance dl between the trench T1 and the through-via 140 is less than about 2 μm, an electrical failure may occur between the dam structure 163 and the through-via 140 or cracking propagating within the passivation layer 114 may bypass the dam structure 163 and then reach the through-via 140. When the spacing distance dl between the trench T1 and the through-via 140 is greater than about 5 μm, the cracking may bypass the dam structure 163 and then reach the through-via 140 in a similar manner. In addition, the dam structure 163 may be required to have a certain level of height so as to prevent/impede the propagation of the cracking. Accordingly, the trench T1 may have a depth Th1 of a predetermined level or more in a vertical direction (a Z-axis direction) to cover a portion of a side surface of the through-via 140. For example, a ratio of the depth Th1 to a maximum distance 114h between the third surface 114S and a first surface 111S1 may be within the range of about 0.5:1 to about 0.8:1. When a ratio of the depth Th1 of the trench T1 to a maximum thickness 114h of the passivation layer 114 is less than 0.5:1, a cracking prevention/reduction effect may be insignificant. When the ratio of the depth Th1 of the trench T1 to the maximum thickness 114h of the passivation layer 114 is greater than 0.8:1, diffusion may occur between the dam structure 163 and the semiconductor layer 111.

The circuit structures 120 and 130 may include a first circuit structure 120 and a second circuit structure 130 stacked on the second surface 111S2 of the semiconductor layer 111. The first circuit structure 120 may include a first interlayer insulating layer 121, a plurality of individual devices 122, and a first wiring structure 123. The first interlayer insulating layer 121 may be disposed on an upper surface of the semiconductor substrate 110 or on an upper surface 111S2 of the semiconductor layer 111, and may include silicon oxide or silicon nitride. The plurality of individual devices 122 may be combined with each other to constitute an integrated circuit (IC). The plurality of individual devices 122 may include various microelectronic devices, for example, a metal-oxide-semiconductor field effect transistor (MOSFET), a system large scale integration (LSI) device, and a micro-electro-mechanical system (MEMS), an active device, a passive device, and the like. The plurality of individual devices 122 may include a gate structure disposed around a conductive region 112. The first wiring structure 123 may include at least one layer of wiring lines extending in a horizontal direction (an X-axis direction) and at least one layer of wiring vias extending in a vertical direction (a Y-axis direction), and may be electrically connected to a plurality of individual devices 122. The first wiring structure 123 may have a multilayer structure including a plurality of wiring lines and a plurality of wiring vias. As illustrated in the drawings, the wiring line of the first wiring structure 123 may be in direct contact with the through-via 140. Alternatively, the wiring line of the first wiring structure 123 may be electrically connected to the through-via 140 through the wiring via. The first wiring structure 123 may include, for example, a metal wiring layer (or a metal via layer), including aluminum (Al), gold (Au), cobalt (Co), copper (Cu), nickel (Ni), lead (Pb), tantalum (Ta), tellurium (Te), titanium (Ti), tungsten (W), or combinations thereof, and a barrier layer disposed between the metal wiring layer and the interlayer insulating layer 121 and including titanium (Ti), titanium nitride (TiN), tantalum (Ta), or tantalum nitride (TaN). It will be understood that, in addition to the first wiring structure 123 illustrated in the drawings, a first wiring structure connected to the individual devices 122 is present but omitted from view in FIG. 2 for simplicity of illustration.

The second circuit structure 130 may include a second interlayer insulating layer 131, disposed on the first circuit structure 120, and a second wiring structure 133 electrically connected to the first wiring structure 123. The second interlayer insulating layer 131 may be disposed on an upper surface of the first circuit structure 120 and may include silicon oxide or silicon nitride. Similarly to the first wiring structure 123, the second wiring structure 133 may include at least one layer of wiring lines and at least one layer of wiring vias. The second wiring structure 133 may also be formed to have a multilayer wiring structure including a plurality of wiring lines and a plurality of wiring vias. It will be understood that, in addition to the second wiring structure 133 illustrated in the drawings, a second wiring structure is present (but omitted from view in FIG. 2 for simplicity of illustration) for connecting the individual devices 122 in the first interlayer insulating layer 121 to each other or for connecting the individual devices 122 to another wiring.

The through-via 140 may extend through at least a portion of the semiconductor chip 100 (FIG. 1) to electrically connect the frontside pad 150 and the backside pad 160 to each other. For example, the through-via 140 may extend through the semiconductor substrate 110 in the vertical direction (the Z-axis direction) to be in contact with the backside pad 160, and may be electrically connected to the frontside pad 150 through the first and second wiring structures 123 and 133. The through-via 140 may include a metal plug 142, extending between upper and lower surfaces of the semiconductor chip 100 and/or between the frontside pad 150 and the backside pad 160, and a barrier layer 141 surrounding the metal plug 142. The metal plug 142 may include a metal, for example, tungsten (W), titanium (Ti), aluminum (Al), or copper (Cu). The metal plug 142 may be formed by a plating process, a physical vapor deposition (PVD) process, or a chemical vapor deposition (CVD) process. The barrier layer 141 may include a metal compound such as tungsten nitride (WN), titanium nitride (TiN), or tantalum nitride (TaN). The barrier layer 141 may be formed by a PVD process or a CVD process. A via insulating layer may be formed on a side surface of the through-via 140. The via insulating layer may have a single-layer structure or a multilayer layer structure. The via insulating layer may include silicon oxide, silicon oxynitride, silicon nitride, a polymer, or combinations thereof.

The frontside pad 150 and the backside pad 160 may be disposed on opposite surfaces of a semiconductor chip (e.g., the chip 100 in FIG. 1), respectively. For example, the frontside pad 150 may be disposed on an active surface of a semiconductor chip in which the circuit structures 120 and 130 are formed. The backside pad 160 may be disposed on an inactive surface opposing the active surface. The frontside pad 150 and the backside pad 160 may be electrically connected to each other through the through-via 140 and the wiring structures 123 and 133. Each of the frontside pad 150 and the backside pad 160 may have a ball shape or a post shape, other than a pad shape. The frontside pad 150 and the backside pad 160 may include a metallic material such as copper (Cu), aluminum (Al), nickel (Ni), silver (Ag), gold (Au), tin (Sn), lead (Pb), titanium (Ti), or the like.

The backside pad 160 may be disposed on a rear surface (or an inactive surface) of the semiconductor chip or on the third surface 114S of the passivation layer 114, and may include a metal layer 161, an electrode pad portion 162, and a dam structure 163. The metal layer 161 may be conformally formed along a certain region of the surface 114S of the passivation layer 114 and an internal surface of the trench T1. The metal layer 161 may be disposed between the dam structure 163 and the passivation layer 114, between the electrode pad portion 162 and the passivation layer 114, and between the electrode pad portion 162 and the through-via 140. The metal layer 161 may cover upper and side surfaces of the dam structure 163 and an upper surface of the electrode pad portion 162. The metal layer 161 may be a seed layer of the electrode pad portion 162 and the dam structure 163, and may include at least one metal selected from the group consisting of titanium (Ti), copper (Cu), cobalt (Co), tungsten (W), and palladium (Pd), and chromium (Cr). A thickness of the metal layer 161 may be within the range of, for example, about 0.05 μm and about 3 μm. The metal layer 161 may be formed through a sputtering process. The electrode pad portion 162 may include a portion, overlapping the through-via 140 in the vertical direction (the Z-axis direction), and a portion extending from the overlapping portion in the horizontal direction (the X-axis direction). The electrode pad portion 162 may include at least one metal selected from the group consisting of copper (Cu), nickel (Ni), gold (Au), tantalum (Ta), and tungsten (W). The electrode pad portion 162 may be formed by an electroplating process. The dam structure 163 may be embedded in the trench T1 of the passivation layer 114 and may be formed to be integrated with the electrode pad portion 162. Accordingly, a boundary between the electrode pad portion 162 and the dam structure 163 may not be apparent. Rather, the dam structure 163 may be a vertically-protruding portion of the electrode pad portion 162. A boundary (dashed lines) between the metal pad portion 162 and the dam structure 163, illustrated in the drawings, may be an imaginary line added for easy understanding of structural features of the present disclosure.

Hereinafter, the dam structure 163 will be described in detail with reference to FIGS. 3A and 3B together. FIGS. 3A and 3B are perspective views illustrating shapes of the electrode pad portion 162, the dam structure 163, and the through-via 140 in an example embodiment. FIGS. 3A and 3B are perspective views illustrating different modified examples of the shape of the dam structure 163, respectively.

Referring to FIG. 2 together with FIG. 3A, the dam structure 163 may protrude from one side of the electrode pad portion 162 toward the first surface 111S1 or the active surface of the semiconductor chip, and may surround a side surface of the through-via 140. As used herein, the terms "surround" and "surrounding" do not require that a first element continuously covers an entire surface of a second element in a vertical and/or circumferential direction. Rather, these terms refer to a border/perimeter that the first element forms either continuously or discontinuously around the surface of the second element. In some embodiments, the dam structure 163 may have a ring shape continuously surrounding the through-via 140. For example, the dam structure 163 may continuously surround a circumference of a portion (e.g., an end portion) of the through-via 140. The dam structure 163 may surround the through-via 140 while having various shapes such as a triangular shape or a rectangular shape, other than a circular shape illustrated in FIG. 3A. The dam structure 163 may have a certain level of spacing distance from the through-via 140 and a certain level of height, as compared with a thickness of the passivation layer 114, to prevent/impede cracking from propagating from outside of the backside pad 160 to the backside pad 160 and to prevent/impede cracking, propagating upwardly of the backside pad 160, from reaching the through-via 140.

For example, the dam structure 163 may be spaced apart from the through-via 140 in first and second directions (the X-axis and Y-axis directions). The dam structure 163 may be spaced apart from the through-via 140 by a spacing distance dl between the trench T1 and the through-via 140. Substantially, the dam structure 163, spaced apart from the through-via 140 by the spacing distance dl between the trench T1 and the through-via 140, may be further spaced apart therefrom by a thickness of the metal layer 161 surrounding the side surface of the dam structure 163. However, since both the dam structure 163 and the metal layer 161 include a conductive material, the dam structure 163 may be considered to be spaced apart from the through-via 140 by the spacing distance dl between the trench T1 and the through-via 140, irrespective of the thickness of the metal layer 161. Accordingly, the dam structure 163 may be spaced apart from the through-via 140 by about 2 µm or more. For example, the spacing distance between the dam structure 163 and the through-via 140 may be within the range of about 2 µm to about 5 µm. When the spacing distance between the dam structure 163 and the through-via 140 is less than about 2 µm, an electrical failure may occur between the dam structure 163 and the through-via 140 or cracking, propagating within the passivation layer 114, may bypass the dam structure 163 and then reach the through-via 140. When the spacing distance between the dam structure 163 and the through-via 140 is greater than about 5 µm, the cracking may bypass the dam structure 163 and then reach the through-via 140 in a similar manner.

In addition, the dam structure 163 may be disposed within a width of the backside pad 160 in horizontal directions (the X-axis and Y-axis directions) to effectively prevent/impede cracking from propagating upwardly of the backside pad 160 from outside of the backside pad 160. In addition, the dam structure 163 may be spaced apart from the side surface of the through-via 140 and may have one side surface coplanar with or spaced apart from a side surface 162SS of the electrode pad portion 162. For example, the backside pad 160 or the electrode pad portion 162 thereof may have a width 160$w$ having a ratio ranging from 5:1 to 3:1 in the first direction (the X direction) relative to a width 140$w$ of the through-via 140, and the dam structure 163 may be disposed within the width 160$w$ of the backside pad 160 or the electrode pad portion 162 thereof. In this case, an external side surface of the dam structure 163 may be spaced apart from or coplanar with the external side surface 162SS of the electrode pad portion 162. The external side surface of the dam structure 163 may be defined as a side surface of the dam structure disposed to oppose an internal side surface of the dam structure 163, facing the through-via 140, on the drawings. Therefore, the dam structure 163 may be formed in a location overlapping the electrode pad portion 162 in the vertical direction (the Z-axis direction). When the dam structure 163 protrudes outwardly of the backside pad 160 to increase a distance to the through-via 140, density of the dam structure 163 around the through-via 140 may be reduced to result in an insignificant cracking prevention/reduction effect.

The dam structure 163 may have a height 163$h$ of a certain level or more in the first direction (the Z-axis direction). When the metal layer 161 is conformally formed on an upper surface of the dam structure 163 and an upper surface of the electrode pad portion 162, the height 163$h$ of the dam structure 163 may be substantially the same as the depth Th1 of the trench T1. For example, a ratio of the height 163$h$ of the dam structure 163 in the first direction (the Z-axis direction) to a maximum thickness 114$h$ of the passivation layer 114 may be within the range of about 0.5:1 to about 0.8:1.

Referring to FIG. 3B, in a modified example, the dam structure 163 may include a plurality of separation walls 163$a$ and 163$b$ discontinuously surrounding the through-via 140. Each of the separation walls 163$a$ and 163$b$ may satisfy conditions for the spacing distance to the through-via 140 and the thickness of the passivation layer 114. A spacing distance w between the separation walls 163$a$ and 163$b$ may be smaller than a spacing distance between the through-via 140 and the separation walls 163$a$ and 163$b$. When the spacing distance w between the separation walls 163$a$ and 163$b$ is greater than the spacing distance between the through-via 140 and the separation walls 163$a$ and 163$b$, it may be difficult to effectively prevent/impede propagation of cracking.

Hereinafter, a cracking propagation prevention/reduction effect, obtained by the dam structure 163 in the package according to an example embodiment, will be described with reference to FIGS. 4A and 4B. FIGS. 4A and 4B are partially enlarged views illustrating a state in which the first and second semiconductor chips 100 and 200 of FIG. 1 are bonded by a connection member 30. FIG. 4A illustrates a propagation aspect of cracking CR on a backside pad 160' before (i.e., without) applying the dam structure 163 according to an example embodiment. FIG. 4B illustrates a propagation aspect of cracking CR on a backside pad 160 after applying the dam structure 163 according to an example embodiment. In FIGS. 4A and 4B, a frontside pad 250 is illustrated as having a similar size as a backside pad 160/160'. The frontside pad 250, illustrated in FIGS. 4A and 4B, may be a connection pad of a bare chip or a bump structure formed on the connection pad, for example, a metal pillar.

Referring to FIG. 4A, when a plurality of semiconductor chips 100 and 200 are stacked, cracking CR may occur in a bonding portion between a backside pad and a frontside pad on which stress is structurally concentrated. For example, when the first semiconductor chip 100 and the second semiconductor chip 200 are bonded, stress may be concentrated on a bonding portion between the first backside pad 160' and the second frontside pad 250 and cracking CR may occur in the passivation layer 114 having relatively low rigidity. The cracking CR may propagate to the first backside pad 160' within the passivation layer 114 to damage even the through-via 140.

Referring to FIG. 4B, in an example embodiment, a dam structure 163, protruding toward the passivation layer 114 to surround a side surface of a through-via 140, may prevent/impede cracking CR from propagating to the through-via 140. For example, the first backside pad 160 may include a dam structure 163 surrounding a lower portion of the side surface of the through-via 140. The dam structure 163 may have a height corresponding to 50% to 80% of a thickness of the passivation layer 114. The dam structure 163 may prevent/impede the cracking CR from propagating upwardly of the first backside pad 160 from outside of the first backside pad 160. According to an example embodiment, since an additional structure (for example, an under-bump metallization (UBM)) is not formed on the backside pad 160, reliability of connection between the through-via 140 and the backside pad 160 may be secured without increasing a thickness of a package in which a plurality of chips are stacked. Moreover, the electrode pad portion 162 and the dam structure 163 may be simultaneously formed by a plating process, so that a dam structure 163 for cracking prevention/reduction may be formed without an additional burdensome process, other than a simple etching process in which a trench is formed in the passivation layer 114.

FIGS. 5A to 5H are schematic cross-sectional views illustrating a method of manufacturing the semiconductor package illustrated in FIG. 2.

Figure 5A:
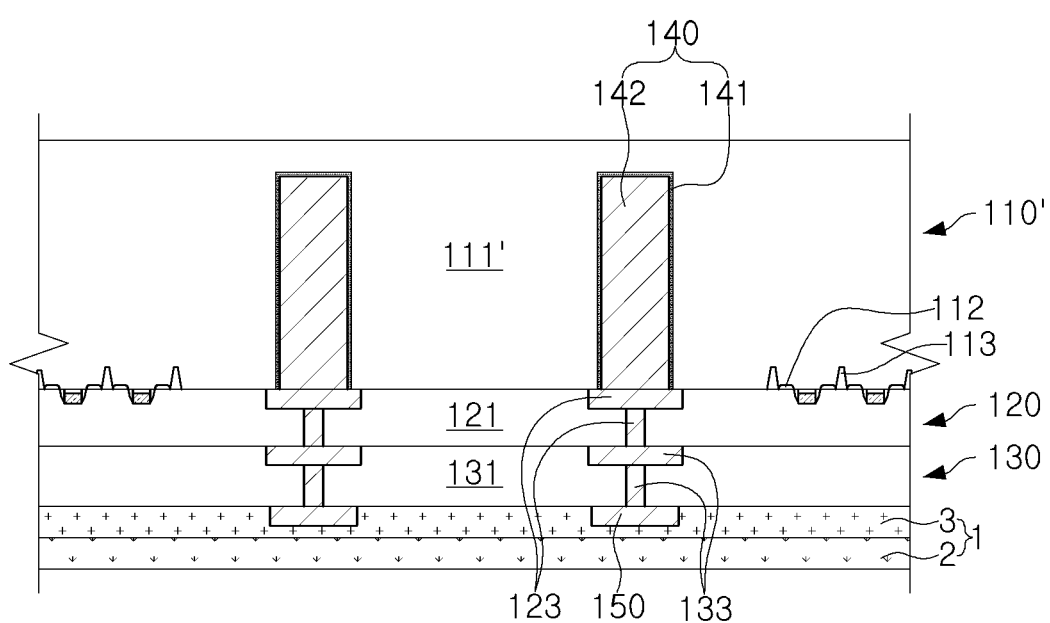
FIGS. 5A to 5H are schematic cross-sectional views illustrating a method of manufacturing the semiconductor package illustrated in FIG. 2.

Referring to FIG. 5A, a semiconductor substrate 110', in which circuit structures 120 and 130 are formed, may be attached to a carrier 1 including a support substrate 2 and an adhesive layer 3. The semiconductor substrate 110' may be in a state in which it includes only a semiconductor layer 111' before a polishing process. The semiconductor layer 111' may be formed to fully cover one end of the through-via 140. The circuit structures 120 and 130 may include interlayer insulating layers 121 and 131 and wiring structures 123 and 133. The semiconductor substrate 110' may be disposed on the carrier 1 such that the circuit structures 120 and 130 face an adhesive layer 3. The frontside pad 150 on the circuit structures 120 and 130 may be embedded in the adhesive layer 3. When an upper surface of the semiconductor substrate 110' or the semiconductor layer 111' thereof (as shown in the drawing) is polished, the support substrate 2 may relieve mechanical stress acting on the semiconductor substrate 110' and may prevent/reduce warpage of the semiconductor substrate 110' thinned after the polishing process. The support substrate 2 may be a glass substrate or a resin substrate. As the adhesive layer 3, an ultraviolet adhesive, a thermoplastic adhesive, or an adhesive tape may be used.

Figure 5B:
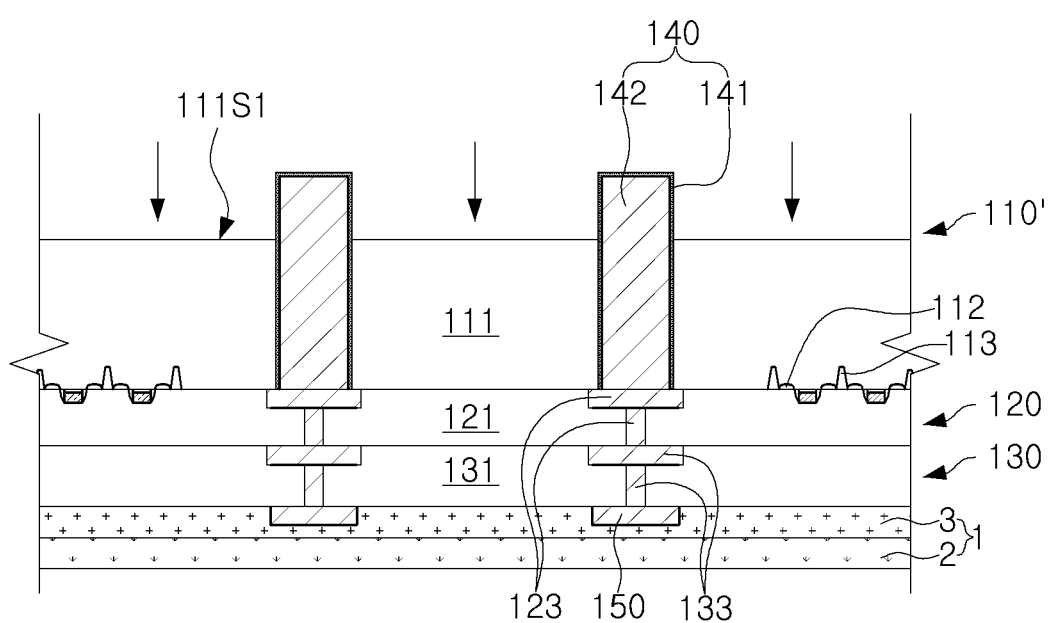

Referring to FIG. 5B, a portion of the semiconductor layer 111' of FIG. 5A may be removed to expose a portion of the through-via 140. The through-via 140 may protrude upwardly of a first surface 111S1 of the semiconductor layer 111 having a certain removed region. The semiconductor layer 111, having a certain removed region, may be thinned to have a thickness of about 10 μm to 100 μm. The semiconductor layer 111' of FIG. 5A may be removed by a CHIP process or/and an etch-back process.

Figure 5C:
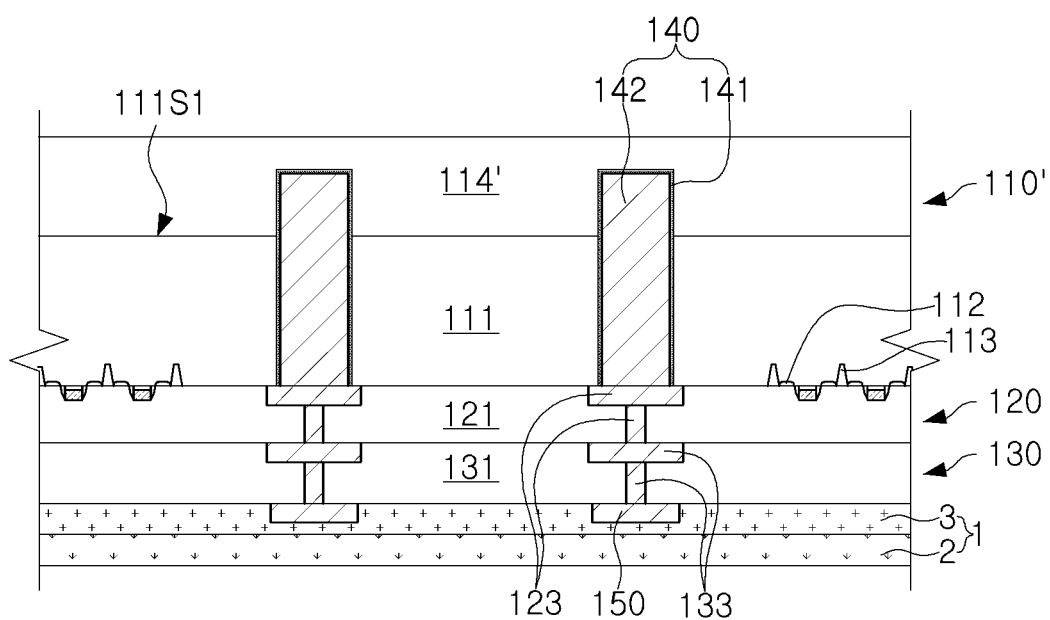

Referring to FIG. 5C, a passivation layer 114' may be formed on the first surface 111S1 of the semiconductor layer 111. The passivation layer 114' may be formed to fully cover an upper surface of the through-via 140 (as shown in the drawing). A portion of the through-via 140 may be removed together with a portion of the passivation layer 114' in a subsequent process. The passivation layer 114' may be a silicon oxide layer, a silicon nitride layer, a polymer layer, or an insulating layer including combinations thereof. The passivation layer 114' may be formed using an oxidation process or a deposition process, for example.

Figure 5D:
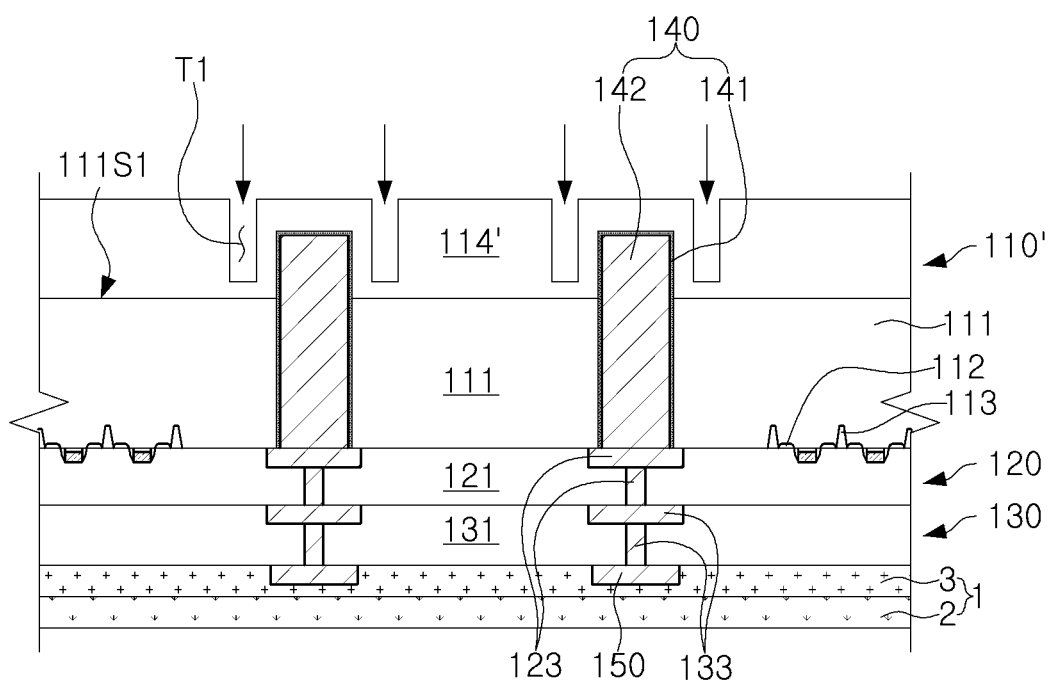

Referring to FIG. 5D, a trench T1 may be formed in an upper surface of the passivation layer 114'. The trench T1 may be formed to be recessed along the periphery of the through-via 140. The trench T1 may be formed by etching the upper surface of the passivation layer 114'. For example, when the passivation layer 114' comprises a silicon oxide layer, a trench T1 may be formed using a solution or gas for etching a mask pattern and the silicon oxide layer. The trench T1 may be formed to have a depth of 50% to 80% of a thickness of the final passivation layer 114' in consideration of a polishing process of the passivation layer 114' to be described later. The trench T1 may be spaced apart from the through-via 140 by about 2 μm or more. When the spacing distance to the through-via 140 is maintained to be about 2 μm or more, a width of the trench T1 is not necessarily limited.

Figure 5E:
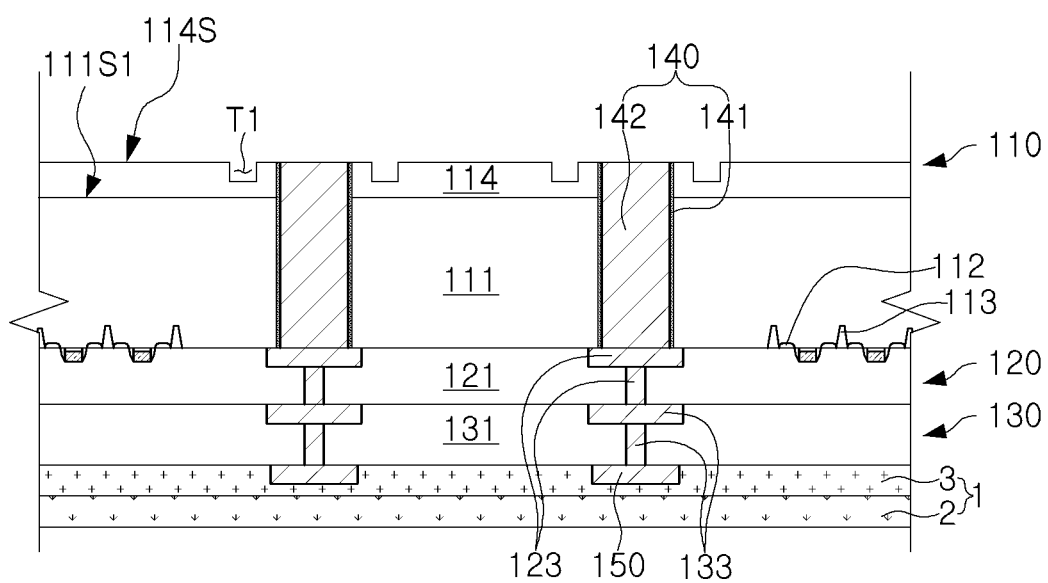

Referring to FIG. 5E, a portion of the passivation layer 114' of FIG. 5D may be removed to form a passivation layer 114. A thickness of the passivation layer 114 may be within the range of about 2 μm to about 5 μm. The passivation layer 114 may be removed by an etch-back process. A surface of a metal plug 142 of the through-via 140 may be exposed adjacent the third surface 114S of the passivation layer 114. The exposed surface of the metal plug 142 may be substantially coplanar with the third surface 114S of the passivation layer 114. A ratio of a thickness of a residual trench T1 to a maximum thickness of the passivation layer 114 may be within the range of 0.5:1 to 0.8:1.

Figure 5F:
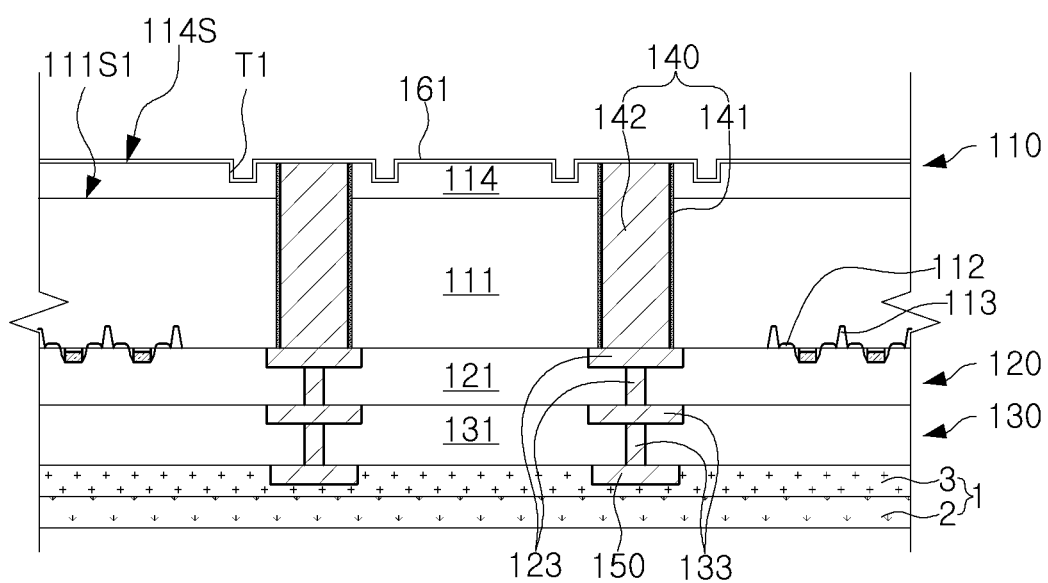

Referring to FIG. 5F, a metal layer 161 may be formed on exposed surfaces of the passivation layer 114, the trench T1, and the through-via 140. The metal layer 161 may be conformally formed along the third surface 114S and a wall surface of the trench T1. The metal layer 161 may include at least one metal selected from the group consisting of titanium (Ti), copper (Cu), cobalt (Co), tungsten (W), palladium (Pd), and chromium (Cr). A thickness of the metal layer 161 may be within the range of, for example, about 0.05 μm to about 3 μm. The metal layer 161 may be formed by a sputtering process.

Figure 5G:
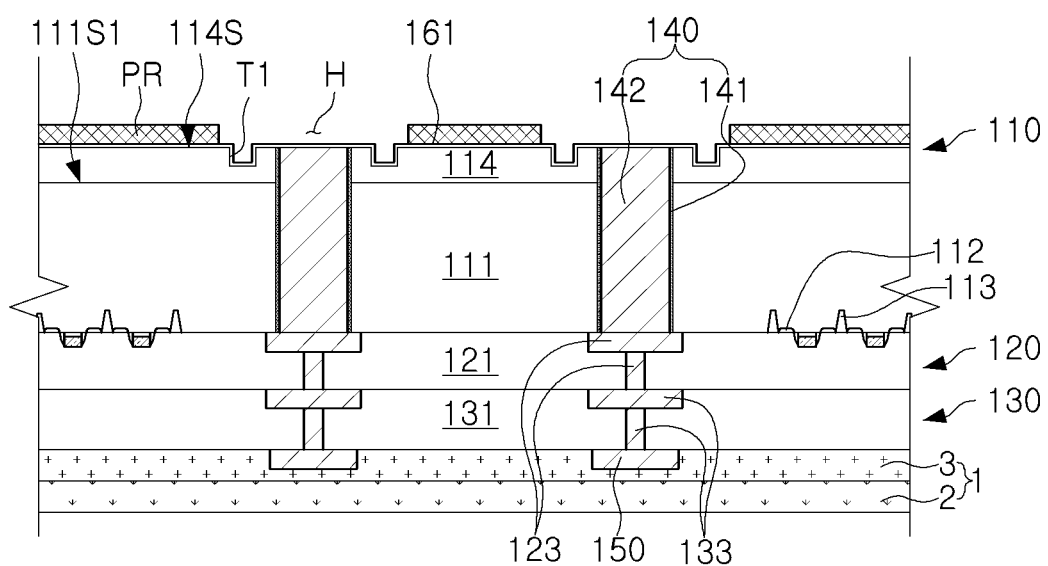

Referring to FIG. 5G, a mask pattern PR may be formed on the metal layer 161. The mask pattern PR may be a patterned photoresist. The mask pattern PR may be formed to expose both the through-via 140 and the trench T1. A ratio of a width of an opening H of the mask pattern PR, exposing the through-via 140 and the trench T1, to a width of the through-via 140 may be within the range of 5:1 to 3:1. Then, the opening H may be filled with a metallic material to form a backside pad. The opening H may be formed by exposure and development processes.

Figure 5H:
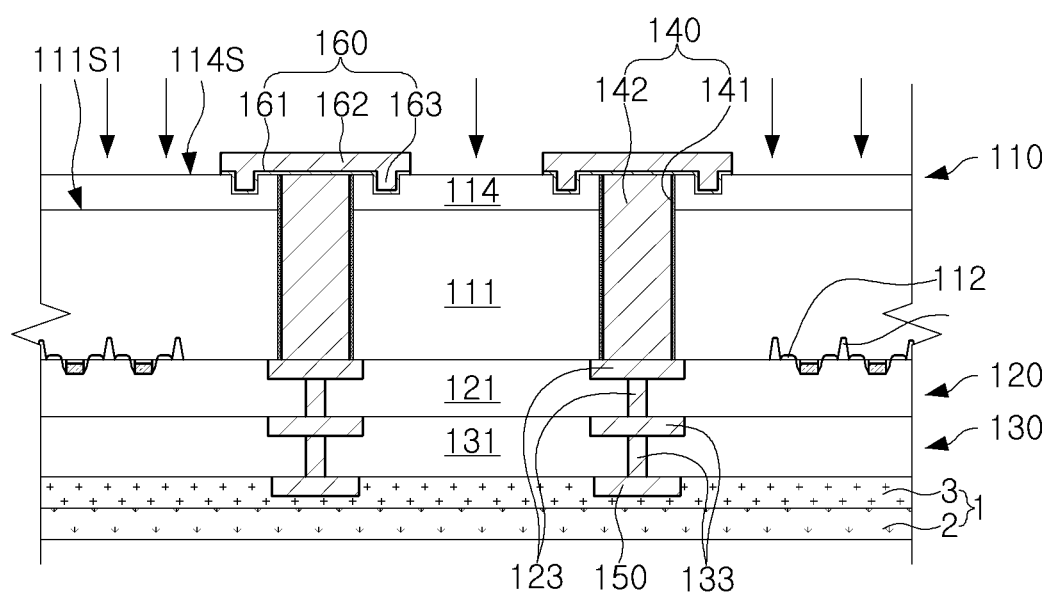

Referring to FIG. 5H, after a backside pad 160 is formed, a portion of the mask pattern PR and a portion of the metal layer 161 of FIG. 5G may be removed. The backside pad 160 may be formed by a plating process using the metal layer 161, exposed through the opening H of FIG. 5G, as a seed layer. The backside pad 160 may include a dam structure 163, filling the trench T1, and an electrode pad portion 162 covering the through-via 140 and the dam structure 163. The electrode pad portion 162 and the dam structure 163 may include at least one metal selected form the group consisting of copper (Cu), nickel (Ni), gold (Au), tantalum (Ta), and tungsten (W). The electrode pad portion 162 and the dam structure 163 may be formed to be integrated with each other. After the backside pad 160 is formed, the mask pattern PR of FIG. 5G may be removed and portions of a residual metal layer 161 on which the backside pad 160 is not formed may be removed. The mask pattern PR may be removed by an ashing process, or the like. The portions of the metal layer 161 may be removed by an etching process.

Figure 6:
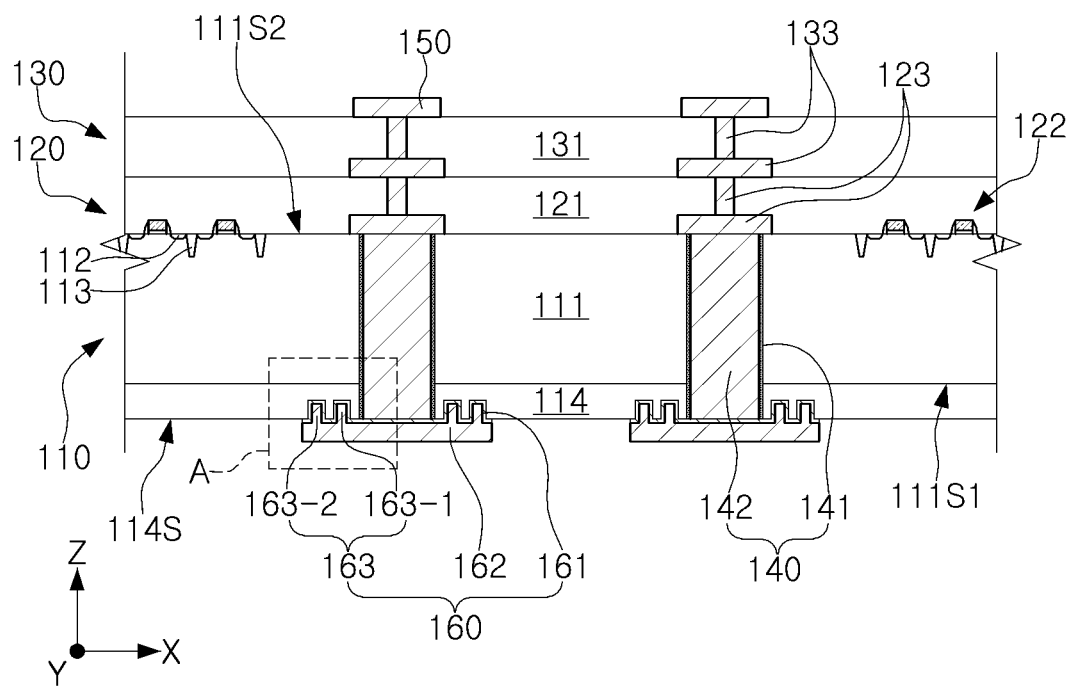
FIG. 6 is a cross-sectional view of a semiconductor package according to an example embodiment.
Figure 7A:
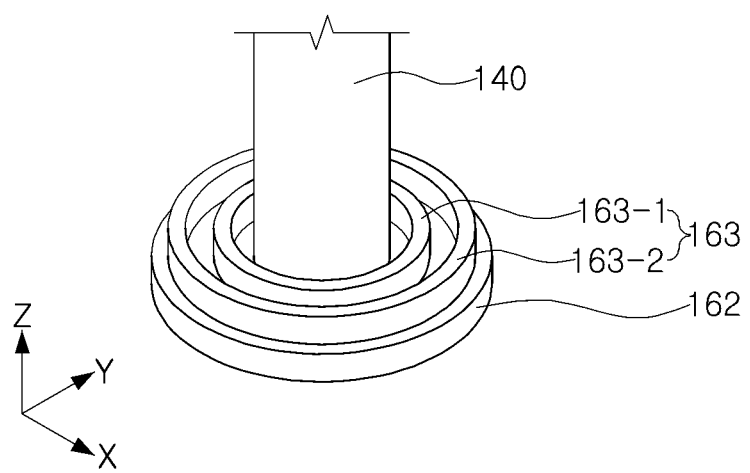
FIGS. 7A and 7B are perspective views of selected components of FIG. 6.
Figure 7B:
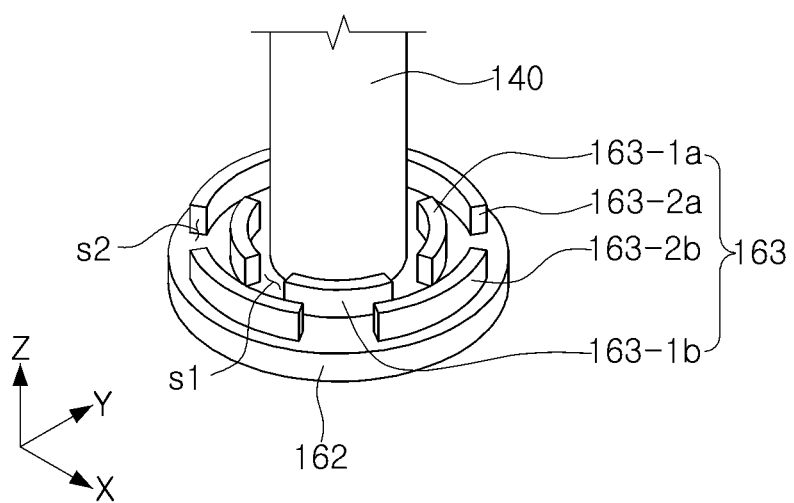
Figure 8A:
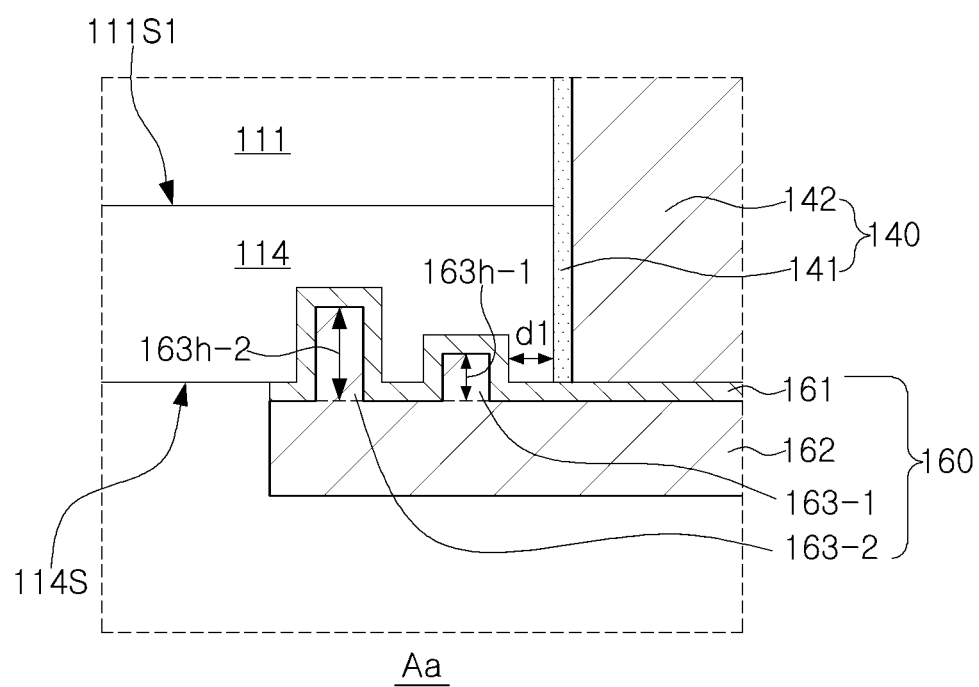
FIGS. 8A and 8B are cross-sectional views illustrating modified examples of selected components in a portion corresponding to region "A" of FIG. 6.
Figure 8B:
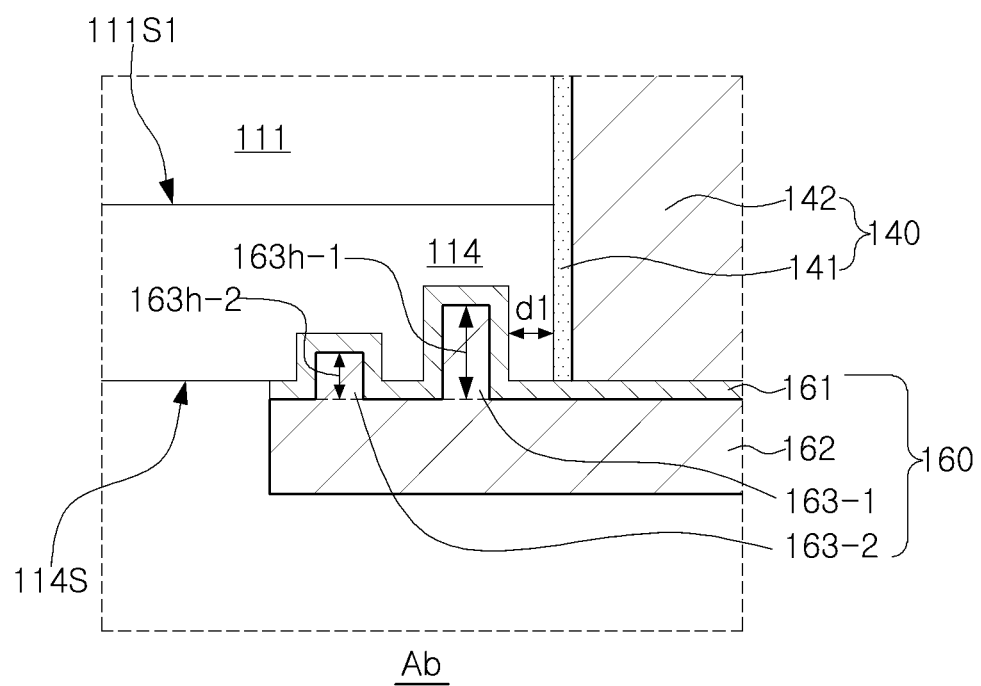

FIG. 6 is a cross-sectional view of a semiconductor package according to an example embodiment, FIGS. 7A and 7B are perspective views of selected components of FIG. 6, FIGS. 8A and 8B are cross-sectional views illustrating modified examples of selected components in a portion corresponding to region "A" of FIG. 6. FIGS. 7A and 7B are perspective views illustrating shapes of the electrode pad portion 162, the dam structure 163, and the through-via 140 in an example embodiment. FIGS. 7A and 7B are perspective views illustrating different modified examples of the shape of the dam structure 163, respectively.

Referring to FIG. 7A together with FIG. 6, a semiconductor package 1000b may include a plurality of dam structures 163-1 and 163-2 sequentially surrounding the periphery of the through-via 140. For example, the dam structure 163 may include a first dam structure 163-1, disposed adjacent to the through-via 140, and a second dam structure 163-2 surrounding the first dam structure 163-1. In this case, a spacing distance between the first dam structure 163-1, closest to the through-via 140, and the through-via 140 in a horizontal direction (an X-axis direction) may be within the range of about 2 μm to about 5 μm. The first and second dam structures 163-1 and 163-2 may collectively doubly surround the periphery of the through-via 140, and may more effectively prevent/impede cracking from propagating to the through-via 140.

Referring to FIG. 7B, the plurality of dam structures 163-1 and 163-2 may include a plurality of separation walls, each discontinuously surrounding the through-via 140. For example, the first dam structure 163-1 may include a plurality of first separation walls 163-1a and 163-1b discontinuously surrounding the through-via 140, and the second dam structure 163-2 may include a plurality of second separation walls 163-2a and 163-2b discontinuously surrounding the through-via 140. A placement relationship between the plurality of first separation walls 163-1a and 163-1b and the plurality of second separation walls 163-2a and 163-2b is not necessarily limited. However, when first spaces s1 between the plurality of first separation walls 161-1a and 163-1b and second spaces s2 between the plurality of second separation walls 163-2a and 163-2b are alternately disposed, propagation of cracking may be effectively prevented/impeded. For example, the first spaces s1 may alternate with the second spaces s2 around a circumference of the through-via 140 such that the first spaces s1 are offset from (e.g., do not horizontally overlap) the second spaces s2.

In addition, the plurality of dam structures 163-1 and 163-2 may have a shape in which the modified examples of FIGS. 7A and 7B are combined with each other. For example, among the plurality of dam structures 163-1 and 163-2, at least one dam structure 163-1 or 163-2 may include a plurality of separation walls 163-1a and 163-1b or 163-2a and 163-2b discontinuously surrounding the through-via 140, as illustrated in FIG. 7B, and the other dam structure 163-1 or 163-2 may have a ring shape continuously surrounding the through-via 140, as illustrated in FIG. 7A.

Hereinafter, another modified example of the plurality of dam structures 163-1 and 163-2 will be described with reference to FIGS. 8A and 8B. FIG. 8A illustrates a region "Aa" corresponding to region "A" of FIG. 6 to compare heights of the first dam structure 163-1 and the second dam structure 163-2 with each other. FIG. 8B illustrates a region "Ab" corresponding to region "A" of FIG. 6 compare heights of the first dam structure 163-1 and the second dam structure 163-2 with each other.

In a modified example, the plurality of dam structures 163-1 and 163-2 may have different heights 163h-1 and 163h-2 in a vertical direction (a Z-axis direction). Among the plurality of dam structures 163-1 and 163-2, a dam structure 163-1 or 163-2 having a relatively great height may have a height corresponding to 50% or more of the maximum thickness of the passivation layer 114. However, the dam structure 163-1 or 163-2 having a relatively small height may be less than the corresponding height. The dam structure 163-1 or 163-2 having a relatively small height may serve to improve adhesion strength between the backside pad 160 and the passivation layer 114.

Referring to FIG. 8A, the plurality of dam structures 163-1 and 163-2 may have a height relatively decreased in a direction toward the through-via 140. For example, the first dam structure 163-1 may be disposed to be closer to the through-via 140 than the second dam structure 163-2, and a height 163h-1 of the first dam structure 163-1 may be smaller than a height 163h-2 of the second dam structure 163-2. The first dam structure 163-1, adjacent to the through-via 140, may have a spacing distance dl of about 2 μm or more to the through-via 140. The second dam structure 163-2, having a relatively great height, may have a height 163h-2 corresponding to 50% to 80% of a maximum thickness of the passivation layer 114.

Referring to FIG. 8B, the plurality of dam structures 163-1 and 163-2 may have a height relatively increased in a direction toward the through-via 140. For example, the first dam structure 163-1 may be disposed to be closer to the through-via 140 than the second dam structure 163-2, and a height 163h-1 of the first dam structure 163-1 may be greater than a height 163h-2 of the second dam structure 163-2. The first dam structure 163-1, adjacent to the through-via 140, may have a spacing distance dl of about 2 μm or more to the through-via 140. The first dam structure 163-1 having a relatively great height may have a height 163h-1 corresponding to 50% to 80% of a maximum thickness of the passivation layer 114.

Figure 9:
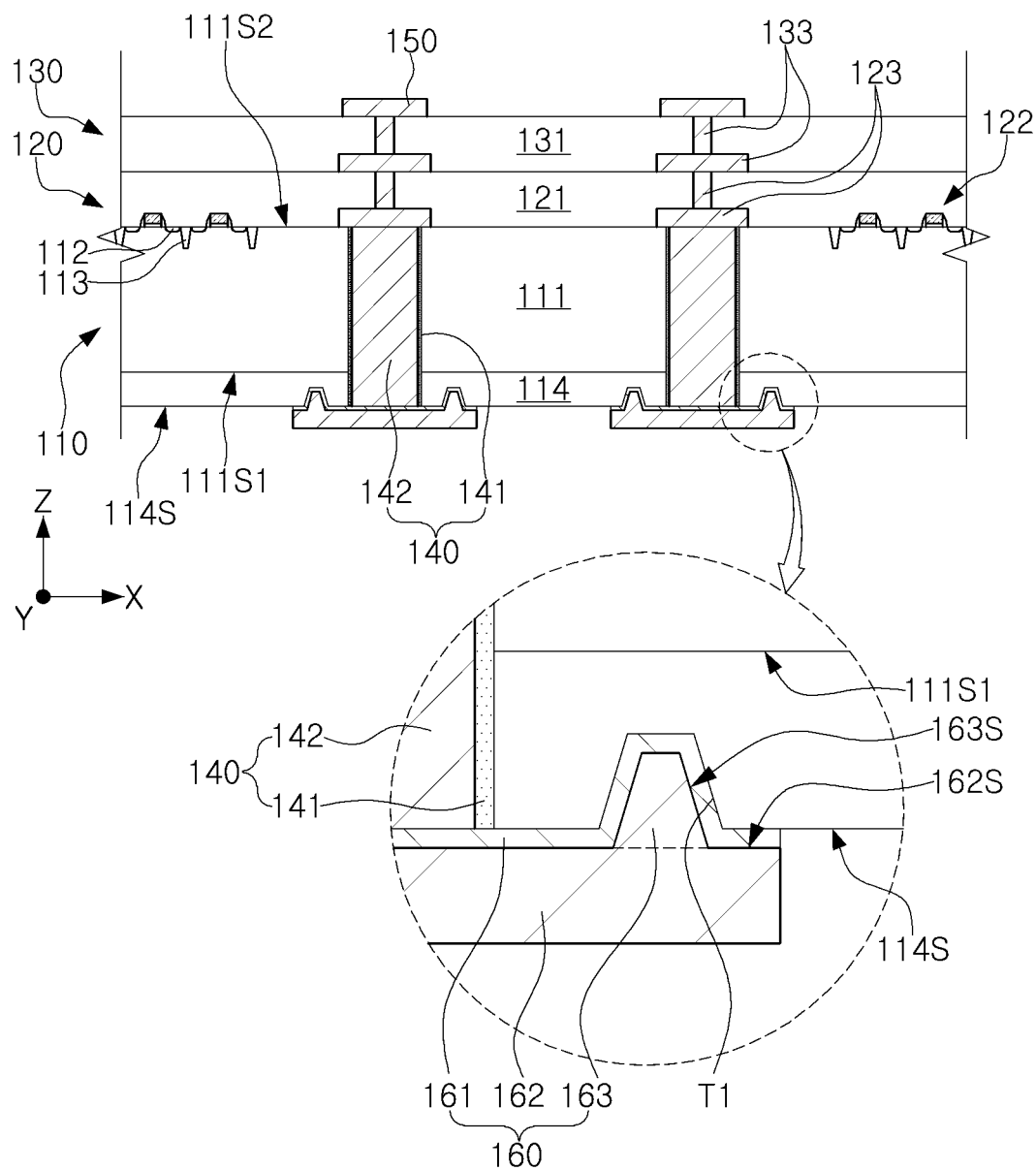
FIG. 9 is a cross-sectional view of a semiconductor package according to an example embodiment.
Figure 10:
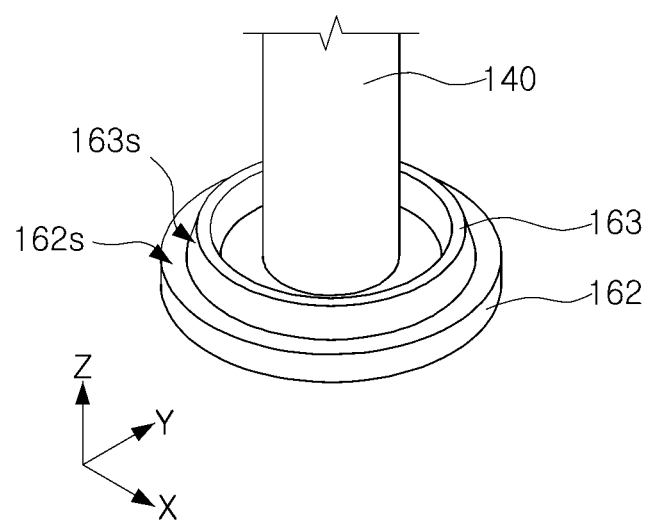
FIG. 10 is a perspective view of selected components of FIG. 9.

FIG. 9 is a cross-sectional view of a semiconductor package 1000c according to an example embodiment, and FIG. 10 is a perspective view of selected components of FIG. 9. FIG. 10 is a perspective view illustrating a shape of an electrode pad portion 162, a dam structure 163, and a through-via 140 in an example embodiment.

Referring to FIGS. 9 and 10, in the semiconductor package 1000c, the dam structure 163 may have a tapered shape in which a width of the dam structure 163 in a horizontal direction (an X-axis direction) is decreased in a direction toward a first surface 111S1 of the dam structure 163. For example, a side surface 163S of the dam structure 163 may have a predetermined slope with respect to an upper surface 162S of the electrode pad portion 162. During a process of etching the passivation layer 114, the trench T1 may be formed to have an upper width greater than a lower width. Accordingly, the dam structure 163 filling the trench T1 may have a side surface 163S tapered toward the first surface 111S1. As illustrated in FIG. 10, the dam structure 163 according to an example embodiment may have a shape surrounding the through-via 140, similarly to what is illustrated in FIG. 3A, other than the tapered shape. In some embodiments, the modified examples of FIGS. 3B, 7A, and 7B may be combined with the dam structure 163 having a tapered shape.

Figure 11:
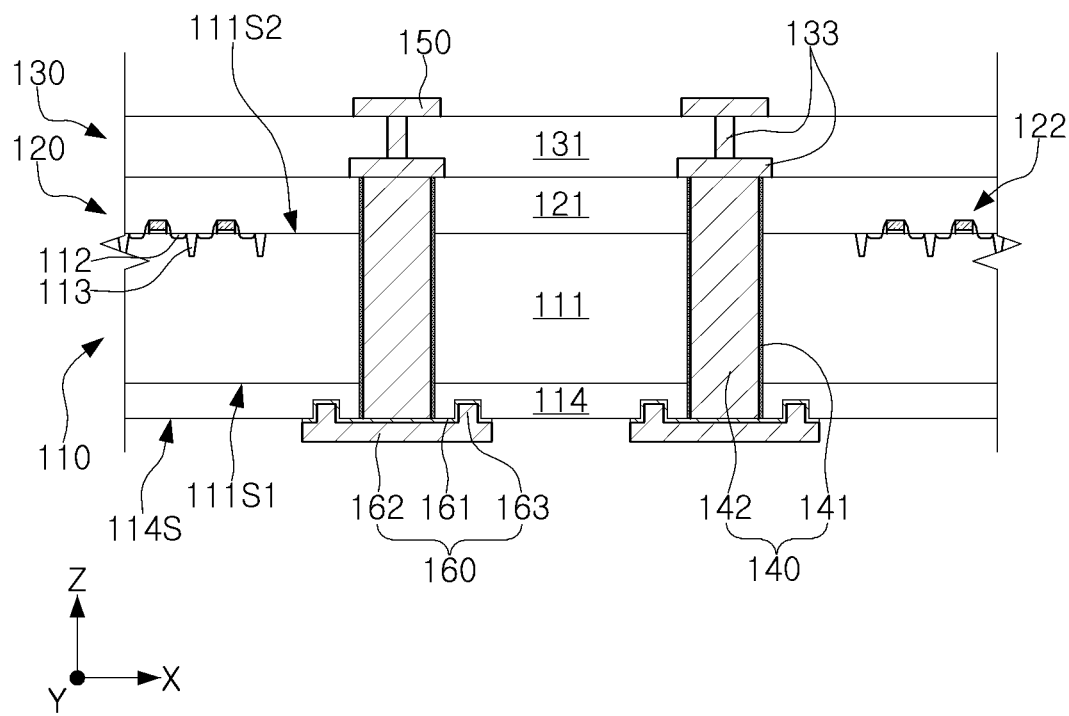
FIG. 11 is a cross-sectional view of a semiconductor package according to an example embodiment.

FIG. 11 is a cross-sectional view of a semiconductor package 1000d according to an example embodiment.

Referring to FIG. 11, in an example embodiment, a through-via 140 may be formed after a first circuit structure 120 is formed on a semiconductor substrate 110. Therefore, the semiconductor package 1000d may include the through-via 140 extending through the semiconductor substrate 110 and penetrating (i.e., extending into) the first circuit structure 120. For example, the circuit structures 120 and 130 include a first circuit structure 120 including a plurality of individual elements 122 and disposed on a second surface 111S2, and a second structure 130 including a second wiring structure 133, electrically connected to the plurality of individual devices 122, and disposed on the first circuit structure 120. The through-via 140 may penetrate the semiconductor substrate 110, including a passivation layer 114 and a semiconductor layer 111, and the first circuit structure 120 and may be electrically connected to a frontside pad 150 through the second wiring structure 133.

Figure 12:
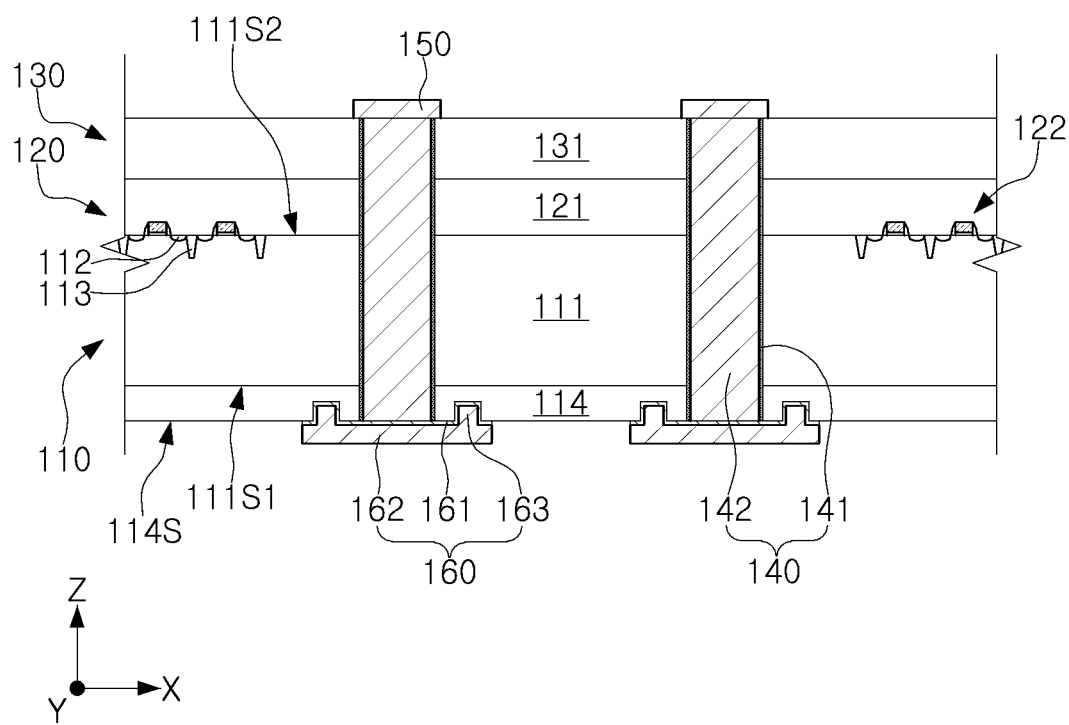
FIG. 12 is a cross-sectional view of a semiconductor package according to an example embodiment.

FIG. 12 is a cross-sectional view of a semiconductor package 1000e according to an example embodiment.

Referring to FIG. 12, a through-via 140 may be formed after first and second circuit structures 120 and 130 are formed on a semiconductor substrate 110. Therefore, the semiconductor package 1000e may include through-vias 140 penetrating through the semiconductor substrate 110 and first and second circuit structures 120 and 130. For example, the circuit structures 120 and 130 include a first circuit structure 120, including a plurality of individual devices 122 and disposed on a second surface 111S2, and a second circuit structure 130 including a second wiring structure 133, electrically connected to the plurality of individual devices 122, and disposed on the first circuit structure 120. The through-via 140 may penetrate a semiconductor substrate 110, including a passivation layer 114 and a semiconductor layer 111, and first and second circuit structures 120 and 130 to be electrically connected to a frontside pad 150 on the second circuit structure. The frontside pad 150 may be protected by a front insulating layer, and a metal bump and a UBM structure may be formed on the frontside pad 150.

Figure 13:
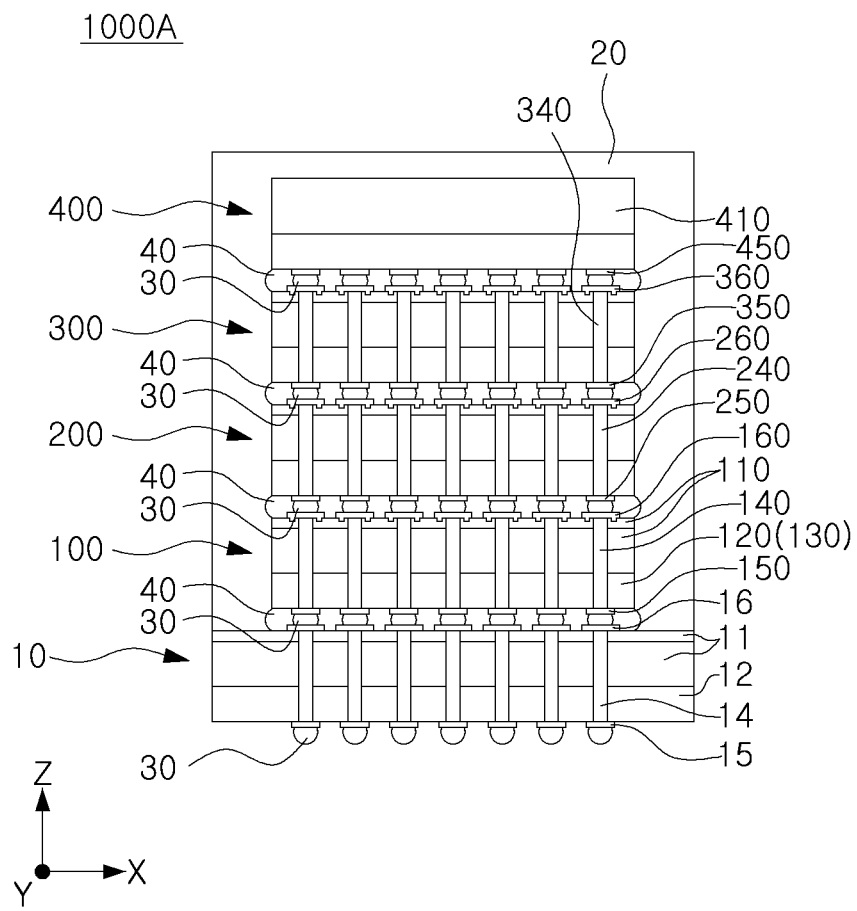
FIG. 13 is a cross-sectional view of a semiconductor package according to an example embodiment.

FIG. 13 is a cross-sectional view of a semiconductor package 1000A according to an example embodiment.

Referring to FIG. 13, the semiconductor package 1000A may include a base chip 10 and a plurality of semiconductor chips 100, 200, 300, and 400 stacked on the base chip 10 in a vertical direction (a Z-axis direction). The semiconductor package 1000A may further include a molding member 20, a connection member 30 electrically connecting the base chip 10 and the plurality of semiconductor chips 100, 200, 300, and 400 to each other, and/or a non-conductive film layer 40 surrounding the connection member 30 between the plurality of semiconductor chips 100, 200, 300, and 400.

A width of the base chip 10 in a horizontal direction (an X-axis direction) may be greater than a width of each of plurality of semiconductor chips 100, 200, 300, and 400 in the horizontal direction (the X-axis direction). This may result from a process in which the plurality of semiconductor chips 100, 200, 300, and 400 in a chip or die state are sequentially stacked on the base chip 10 in a wafer state, and the base chip 10 is then cut into individual chips.

The base chip 10 may include a base substrate 11, a circuit structure 12 disposed on a lower surface of the base substrate 11, and a through-via 14 penetrating through at least a portion of the base substrate 11 and a portion of the circuit structure 12, and a lower connection pad 15 and an upper connection pad 16, respectively disposed on a lower surface and an upper surface of the base chip 10. Unlike the plurality of semiconductor chips 100, 200, 300, and 400 stacked on the base chip 10, the base chip 10 may be a dummy semiconductor chip which does not include individual devices. The base chip 10 may be a buffer chip receiving at least one of a control signal, a power supply signal, and a ground signal for operating the plurality of semiconductor chips 100, 200, 300, and 400 through a through-via 14, or a buffer chip receiving a data signal to be stored in the plurality of semiconductor chips 100, 200, 300, and 400 from an external entity, or a buffer chip providing data, stored in the plurality of semiconductor chips 100, 200, 300, and 400, to an external entity.

The base substrate 11 may include, for example, a semiconductor layer, including silicon or the like, and a backside insulating layer disposed on the semiconductor layer. The backside insulating layer may include a silicon oxide layer, a silicon nitride layer, or a polymer layer, or the like. The circuit structure 12 may include a silicon oxide layer, a silicon nitride layer, or an interlayer insulating layer, in which the silicon oxide layer and the silicon nitride layer are combined, and a wiring structure in the interlayer insulating layer. The through-via 14 may penetrate the base substrate 11 and the circuit structure 12 to extend from an upper surface of the base chip 10 to a lower surface of the base chip 10. As illustrated in the drawing, the through-via 14 may penetrate the circuit structure 12 to be directly connected to the lower connection pad 15. However, example embodiments are not limited thereto, and the through-via 14 may penetrate only the base substrate 11 and may be electrically connected to the lower connection pad 15 through a wiring structure of the circuit structure 12. The connection pads 15 and 16 may include at least one of aluminum (Al), copper (Cu), nickel (Ni), tungsten (W), platinum (Pt), and gold (Au).

The molding member 20 may encapsulate the plurality of semiconductor chips 100, 200, 300, and 400 on the base chip 10. The molding member 20 may cover side surfaces of the plurality of semiconductor chips 100, 200, 300, and 400 to prevent/protect the plurality of semiconductor chips 100, 200, 300, and 400 from being exposed to an external entity. In the drawing, the molding member 20 is illustrated as covering an upper surface of an uppermost semiconductor chip 400. However, in other embodiments, the molding member 20 may expose the upper surface of the uppermost semiconductor chip 400. The molding member 20 may include an insulating resin, for example, an epoxy molding compound (EMC). The connection member 30 may electrically connect the semiconductor package 1000A to a mounting substrate (for example, 50 of FIG. 14). The connection member 30 may include a conductive material, which is not limited to a particular conductive material. The connection member 30 may have a land, ball, or pin structure. The connection member 30 may have a multilayer structure including a copper pillar and a solder, or a single-layer structure including a tin-silver (Sn—Ag) solder or copper. The non-conductive film layer 40 may include an adhesive resin, and may bond the plurality of semiconductor chips 100, 200, 300, and 400 to each other. The adhesive resin may be a thermosetting resin and may include, for example, an epoxy resin.

The plurality of semiconductor chips 100, 200, 300, and 400 may have the same technical features as described with reference to FIGS. 1 and 2. For example, in an example embodiment, the semiconductor package 1000A may include first to fourth semiconductor chips 100, 200, 300, and 400 stacked in a vertical direction (a Z-axis direction). A first backside pad 160, disposed on an upper surface of the first semiconductor chip 100, and a second frontside pad 250, disposed on a lower surface of the second semiconductor chip 200, may be electrically connected to each other through the connection member 30. Similarly, the base chip 10 and the first semiconductor chip 100, the second semiconductor chip 200 and the third semiconductor chip 300, and the third semiconductor chip 300 and the fourth semiconductor chip 400 may be physically and electrically connected to each other. The first to fourth semiconductor chips 100, 200, 300, and 400 may be memory chips and/or logic chips. The first to third semiconductor chips 100, 200, and 300, connected to the semiconductor chips disposed thereon through the connection member 30, may include backside pads 160, 260, and 360 having dam structures, respectively. In the drawing, through-vias 140, 240, and 340 are illustrated as being directly connected to the frontside pads 150, 250, and 350 and the backside pads 160, 260, and 360. However, it will be readily understood, based on the foregoing, that the through-vias 140, 240, and 340 may be electrically connected to the frontside pads 150, 250, and 350 through a wiring structure of a circuit structure. As compared with FIGS. 1 and 2, in FIG. 13, the top and bottom of the first semiconductor chip 100 are inverted such that the frontside pad 150 faces downwardly and the backside pad 160 faces upwardly. In addition, the first and second circuit structures 120 and 130 are illustrated as a single layer without an apparent boundary therebetween.

Figure 14:
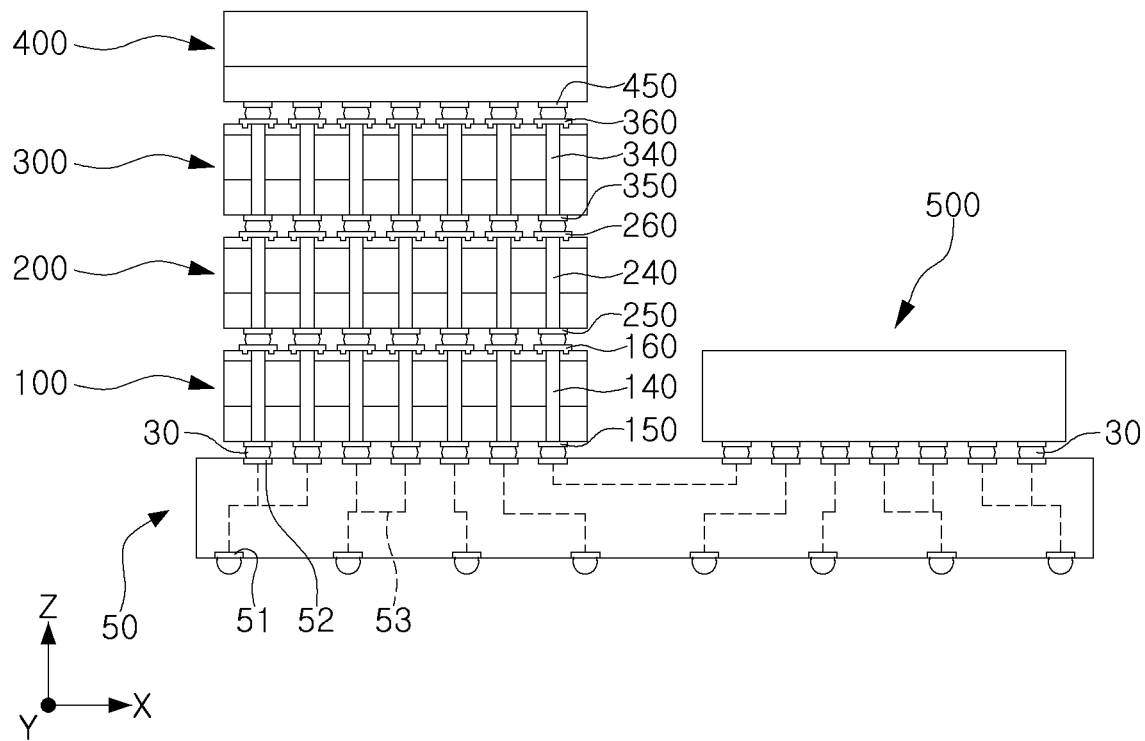
FIG. 14 is a cross-sectional view of a semiconductor package according to an example embodiment.

FIG. 14 is a cross-sectional view of a semiconductor package 1000B according to an example embodiment.

Referring to FIG. 14, the semiconductor package 1000B may include a main semiconductor chip 500, attached to a mounting substrate 50, and a plurality of semiconductor chips 100, 200, 300, and 400 sequentially stacked on the mounting substrate 50 to be adjacent to the main semiconductor chip 500.

The mounting board 50 may include a lower terminal 51 and an upper terminal 52, respectively disposed on a lower surface and an upper surface, and a connection wiring 53 electrically connecting the lower and upper terminals 51 and 52 to each other. The mounting substrate 50 may be a substrate for a semiconductor package, such as a printed circuit board (PCB), a ceramic substrate, and a tape wiring board, or the like. For example, the mounting substrate 50 may be a silicon interposer substrate having a through-silicon via (TSV).

The main semiconductor chip 500 may be a processing unit such as a central processing unit (CPU) or a graphics processing unit (GPU). The main semiconductor chip 500 may be a package for which a normal operation has been verified, for example, a known good package (KGP). The main semiconductor chip 500 may be electrically connected to the mounting substrate 50 through the connection member 30.

As previously described in FIG. 13, the plurality of semiconductor chips 100, 200, 300, and 400 may be electrically connected to each other through the through-vias 140, 240, 340 and the connection member 30. The plurality of semiconductor chips 100, 200, 300, 400 may include a volatile memory chip such as a DRAM or an SRAM, or a nonvolatile memory chip such as a PRAM, an MRAM, a RRAM, or a flash memory. The plurality of semiconductor chips 100, 200, 300, and 400 may be packaged in the form of the example embodiment illustrated in FIG. 13 to be attached to the mounting substrate 50. Since the plurality of semiconductor chips 100, 200, 300, and 400 have technical characteristics similar to those described in FIG. 13, repeated detailed descriptions thereof will be omitted.

Figure 15:
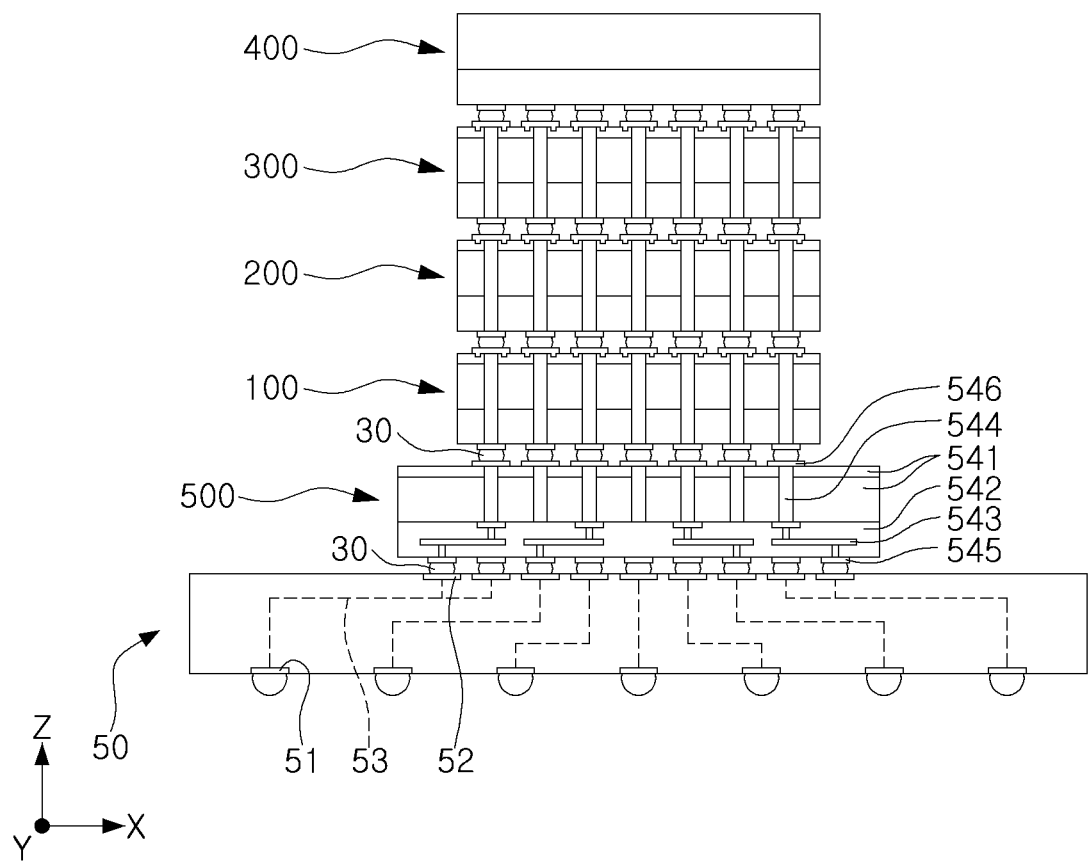
FIG. 15 is a cross-sectional view of a semiconductor package according to an example embodiment.

FIG. 15 is a cross-sectional view of a semiconductor package 1000C according to an example embodiment.

Referring to FIG. 15, a semiconductor package 1000C may include a main semiconductor chip 500, attached to a mounting substrate 50, and a plurality of semiconductor chips 100, 200, 300, and 400 stacked on the main semiconductor chip 500 in a vertical direction (a Z-axis direction).

The main semiconductor chip 500 may be a processing unit such as a central processing unit (CPU) or a graphics processing unit (GPU). The main semiconductor chip 500 may be a package for which a normal operation has been verified, for example, a known good package (KGP). In an example embodiment, the main semiconductor chip 500 may include a semiconductor substrate 541, a circuit structure 542, a through-via 544, and a lower terminal 545 and an upper connection terminal 546. The circuit structure 542 may include a wiring structure 543 connecting the through-via 544 and the lower connection terminal 545 to each other. The circuit structure 542 may include a plurality of individual devices electrically connected to the wiring structure 543, for example, a MOSFET, a system LSI, a MEMS, an active device, a passive device, and the like. In the drawing, the through-via 544 is illustrated as being connected to the lower connection terminal 545 through the wiring structure 543. However, the through-via 544 may penetrate the circuit structure 542 to be electrically connected to the lower connection terminal 545. Since the remaining semiconductor substrate 541, the through-vias 544, and the lower and upper connection terminals 545 and 546 have characteristics similar to those of the base chip described in FIG. 13, detailed descriptions thereof will be omitted.

The plurality of semiconductor chips 100, 200, 300, 400 may be stacked on the upper surface of the main semiconductor chip 500 in a vertical direction (Z-axis direction), and may be electrically connected to the main substrate chip 500 and the mounting substrate 50 through the upper connection terminal 546 and the through-via 544. The plurality of semiconductor chips 100, 200, 300, 400 may include a memory chip. Since the plurality of semiconductor chips 100, 200, 300, and 400 have technical characteristics similar to those described in FIG. 13, repeated detailed descriptions will be omitted.

As described above, a dam structure surrounding a through-via may be introduced into a lower portion of a pad in contact with the through-via. Thus, a semiconductor package having improved reliability of a through-via may be provided.

While example embodiments have been shown and described above, it will be apparent to those skilled in the art that modifications and variations could be made without departing from the scope of the present invention as defined by the appended claims.

What is claimed is:

1. A semiconductor package comprising:
a plurality of semiconductor chips electrically connected to each other and stacked in a first direction,
wherein at least one of the plurality of semiconductor chips includes
a semiconductor substrate including a semiconductor layer having a first surface and a second surface that are opposite each other,
a passivation layer on the first surface and having a third surface that is opposite the first surface,
a circuit structure on the second surface,
a frontside pad on the circuit structure,
a backside pad on the third surface, and
a through-via in the semiconductor substrate and extending between the second surface and the third surface to be electrically connected to the backside pad and the frontside pad,
wherein the backside pad includes an electrode pad portion, on the third surface, and a dam structure protruding into the passivation layer toward the first surface of the semiconductor layer on one side of the electrode pad portion and surrounding a side surface of the through-via,
wherein the dam structure is spaced apart from the side surface of the through-via, and
wherein a height of the dam structure in the first direction into the passivation layer is less than a thickness of the passivation layer.

2. The semiconductor package of claim 1,
wherein the dam structure penetrates the third surface of the passivation layer,
wherein a ratio of the height of the dam structure in the first direction to a maximum thickness of the passivation layer is within a range of about 0.5:1 to about 0.8:1,
wherein the through-via and the dam structure are spaced apart from each other in a second direction that is perpendicular to the first direction, and
wherein a spacing distance between the through-via and the dam structure is within a range of about 2 micrometers ($\mu$m) to about 5 $\mu$m.

3. The semiconductor package of claim 1, wherein the backside pad further includes a metal layer between the dam structure and the passivation layer, between the electrode pad portion and the passivation layer, and between the electrode pad portion and the through-via.

4. The semiconductor package of claim 3, wherein a thickness of the metal layer is within a range of about 0.05 micrometers ($\mu$m) to about 3 $\mu$m.

5. The semiconductor package of claim 3,
wherein the electrode pad portion and the dam structure include at least one of copper, nickel, gold, tantalum, or tungsten, and
wherein the metal layer includes at least one of titanium, copper, cobalt, or tungsten.

6. The semiconductor package of claim 1, wherein the dam structure has a ring shape continuously surrounding the through-via.

7. The semiconductor package of claim 1,
wherein the dam structure includes a plurality of separation walls discontinuously surrounding the through-via, and
wherein a spacing distance between the plurality of separation walls is smaller than a spacing distance between the through-via and the plurality of separation walls.

8. The semiconductor package of claim 1, wherein a width of the dam structure is tapered toward the first surface.

9. The semiconductor package of claim 1, wherein the circuit structure includes
a first circuit structure on the second surface and including a plurality of individual devices and a first wiring structure that is electrically connected to the plurality of individual devices, and
a second circuit structure on the first circuit structure and including a second wiring structure electrically connected to the first wiring structure, and
wherein the through-via is electrically connected to the frontside pad through the first and second wiring structures.

10. The semiconductor package of claim 1, wherein the circuit structure includes
a first circuit structure on the second surface and including a plurality of individual devices, and
a second circuit structure on the first circuit structure and including a wiring structure electrically connected to the plurality of individual devices, and
wherein the through-via extends through the semiconductor substrate and penetrates the first circuit structure and is electrically connected to the frontside pad through the wiring structure.

11. The semiconductor package of claim 1, wherein the circuit structure includes
a first circuit structure on the second surface and including a plurality of individual devices, and
a second circuit structure on the first circuit structure, and
wherein the through-via penetrates the semiconductor substrate and the first and second circuit structures to be electrically connected to the frontside pad.

12. The semiconductor package of claim 1, wherein the passivation layer includes at least one of silicon oxide or silicon nitride.

13. The semiconductor package of claim 12, wherein a thickness of the passivation layer is within a range of about 2 micrometers ($\mu$m) to about 5 $\mu$m.

14. The semiconductor package of claim 1, wherein the passivation layer and the first surface of the semiconductor substrate define a planar interface extending from the through-via to an edge of the backside pad.

15. The semiconductor package of claim 1,
wherein the dam structure includes a first dam structure, adjacent to the through-via, and a second dam structure surrounding the first dam structure, and
wherein a spacing distance between the first dam structure and the through-via in a second direction, perpendicular to the first direction, is within a range of about 2 micrometers ($\mu$m) to about 5 $\mu$m.

16. A semiconductor package comprising:
a plurality of semiconductor chips electrically connected to each other and stacked in a first direction,
wherein at least one of the plurality of semiconductor chips includes,
a semiconductor substrate including a semiconductor layer having a first surface and a second surface that are opposite each other, a passivation layer on the first surface and having a third surface that is opposite the first surface, a circuit structure on the second surface, a frontside pad on the circuit structure, a backside pad on the third surface, and a through-via in the semiconductor substrate and extending between the second surface and the third surface to be electrically connected to the backside pad and the frontside pad, wherein the backside pad includes an electrode pad portion, on the third surface, and a dam structure protruding toward the first surface on one side of the electrode pad portion and surrounding a side surface of the through-via, wherein the dam structure is spaced apart from the side surface of the through-via, wherein the dam structure includes a first dam structure, adjacent to the through-via, and a second dam structure surrounding the first dam structure, and wherein a spacing distance between the first dam structure and the through-via in a second direction, perpendicular to the first direction, is within a range of about 2 micrometers (μm) to about 5 μm.

17. The semiconductor package of claim 16, wherein one of the first and second dam structures includes a plurality of separation walls discontinuously surrounding the through-via, and wherein the other one of the first and second dam structures has a ring shape continuously surrounding the through-via.

18. The semiconductor package of claim 16, wherein the first dam structure includes a plurality of first separation walls discontinuously surrounding the through-via, wherein the second dam structure includes a plurality of second separation walls discontinuously surrounding the through-via, and wherein a first space between the plurality of first separation walls and a second space between the plurality of second separation walls are offset from each other.

19. The semiconductor package of claim 16, wherein a height of the first dam structure in the first direction and a height of the second dam structure in the first direction are different from each other.

20. A semiconductor package comprising:

a first semiconductor chip including a semiconductor layer having a first surface and a second surface that are opposite each other, a passivation layer having a third surface that is opposite the first surface and a trench that is in the third surface, a through-via penetrating the semiconductor layer and the passivation layer, and a backside pad on the third surface and electrically connected to the through-via;

a second semiconductor chip including a frontside pad and on the first semiconductor chip such that the frontside pad faces the backside pad; and a connection bump electrically connecting the backside pad and the frontside pad to each other, wherein the trench is spaced apart from the through-via in a first direction horizontal to the third surface, wherein a spacing distance between the trench and the through-via is within a range of about 2 micrometers (μm) to about 5 μm, wherein a ratio of a depth of the trench in a second direction, perpendicular to the third surface, to a maximum distance between the third surface and the first surface is about 0.5:1 to about 0.8:1, and wherein the backside pad includes a dam structure in the trench.

* * * * *